(12) United States Patent
Okuyama et al.

(10) Patent No.: US 6,715,197 B2
(45) Date of Patent: Apr. 6, 2004

(54) LAMINATED CERAMIC ELECTRONIC COMPONENT AND METHOD FOR MANUFACTURING SAME

(75) Inventors: Shingo Okuyama, Takefu (JP); Tadahiro Nakagawa, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/862,205

(22) Filed: May 22, 2001

(65) Prior Publication Data

US 2002/0008606 A1 Jan. 24, 2002

(30) Foreign Application Priority Data

May 22, 2000 (JP) ........................................ 2000-150204

(51) Int. Cl.$^7$ ................................................ H01S 4/00
(52) U.S. Cl. ..................... 29/592.1; 336/200; 29/602.1; 29/738; 29/745; 29/746; 29/830; 29/846; 361/301.4; 361/306.3; 361/307
(58) Field of Search ........................ 336/200; 29/602.1, 29/738, 745, 746, 830, 846; 361/301.4, 306.3, 307, 308.1, 309, 321.2

(56) References Cited

U.S. PATENT DOCUMENTS 6,114,936 A * 9/2000 Yamamoto et al. ......... 336/192
6,189,200 B1 * 2/2001 Takeuchi et al. ........... 29/602.1
6,331,929 B1 * 12/2001 Masuda ...................... 361/303

* cited by examiner

Primary Examiner—Lincoln Donovan
Assistant Examiner—Jennifer A. Poker
(74) Attorney, Agent, or Firm—Keating & Bennett, LLP

(57) ABSTRACT

A laminated ceramic electronic component significantly simplifies a step of forming external electrodes and has reliable electrical connection between an internal electrode and the external electrodes. A method for manufacturing the laminated ceramic electronic component includes the steps of forming composite sheets each having a conductor and a ceramic layer provided at the sides of the conductor on a carrier film, laminating the composite sheets with each other for forming a mother laminate, cutting the mother laminate in the thickness direction thereof so as to divide the conductor for forming laminates each forming one laminated ceramic electronic component, in which the conductor is exposed on the cut surface of the laminate, and firing the laminate so as to simultaneously form external electrodes from the exposed conductors and a sintered ceramic body.

61 Claims, 19 Drawing Sheets

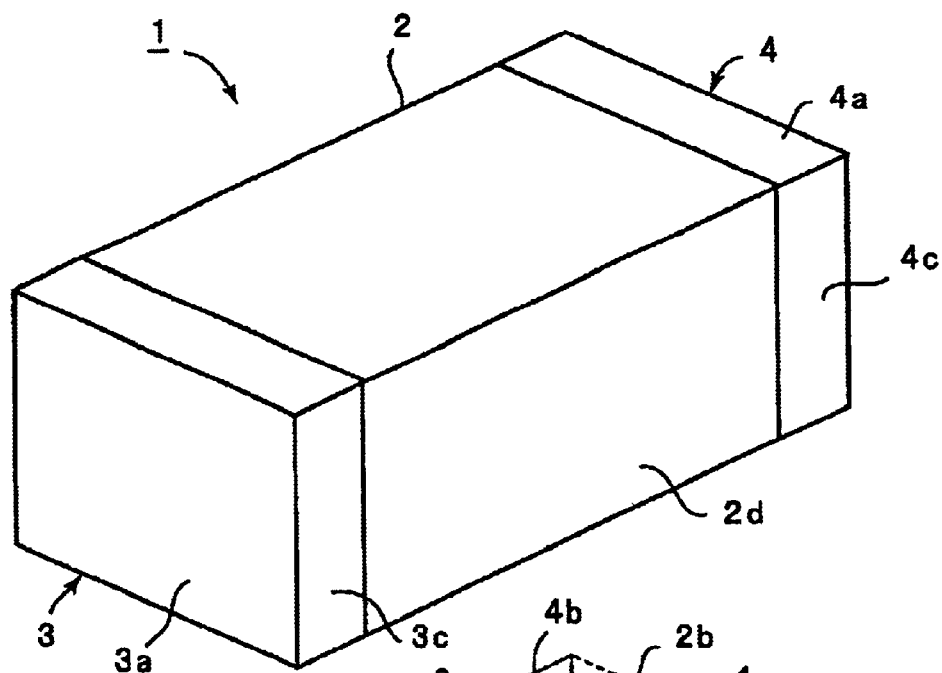
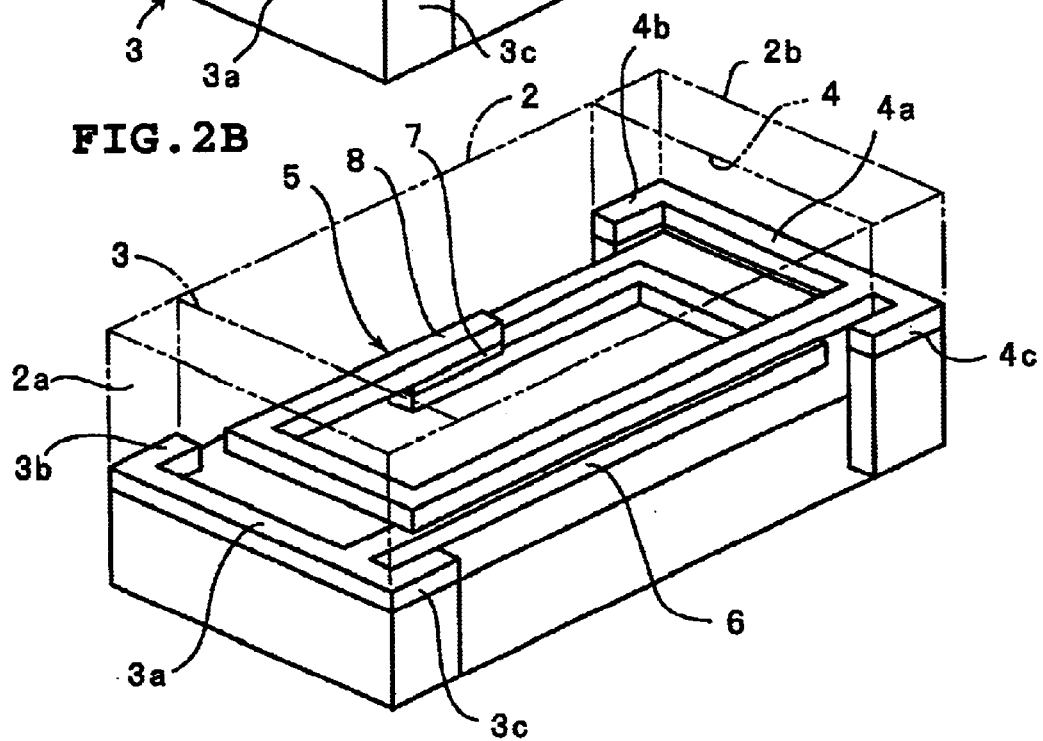

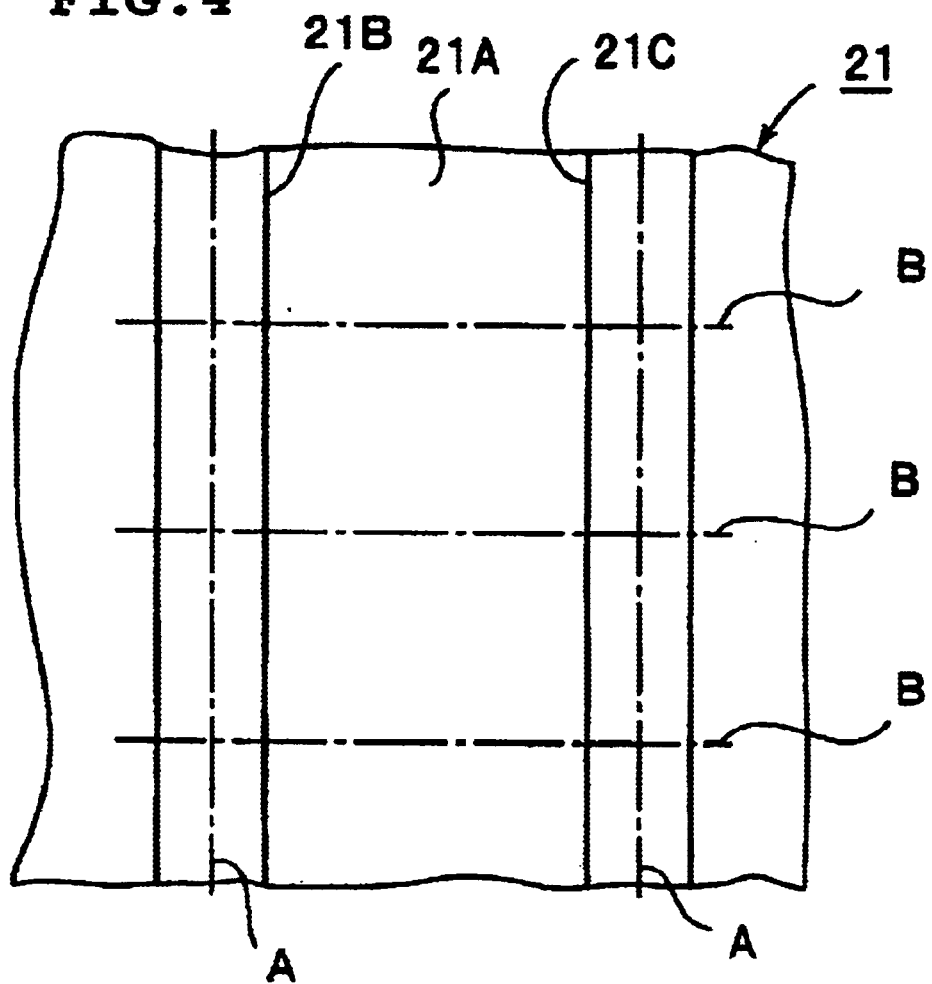

LAMINATED CERAMIC ELECTRONIC COMPONENT AND METHOD FOR MANUFACTURING SAME

BACKGROUND OF THE INVENTION

1. Field of the Invention

The present invention relates to methods for manufacturing laminated ceramic electronic components, such as laminated capacitors, and more particularly, the present invention relates to a method including an improved step of forming external electrodes for manufacturing a laminated ceramic electronic component.

2. Description of the Related Art

Conventionally, laminated ceramic electronic components, such as laminated inductors, are manufactured by a method described below. First, a ceramic green sheet is formed on a carrier film, such as a polyethylene terephthalate film. Subsequently, on the ceramic green sheet, an internal electrode is printed by screen printing or other process. Next, after the ceramic green sheet formed on the carrier film is laminated on a lamination stage or on a ceramic green sheet previously laminated thereon and is then bonded by compressing, the carrier sheet is then removed. The steps described above are repeatedly performed. Alternatively, ceramic green sheets separated from the corresponding carrier films are laminated with each other and are then bonded by compressing. As described above, a mother laminate is produced.

Subsequently, the mother laminate is cut into individual laminates each forming one laminated ceramic element. The individual laminate thus formed defining one laminated ceramic electronic component is fired, thereby yielding a sintered body. The sintered bodies are processed by barrel polishing to form round corner portions and are then aligned by using an aligning tool.

Next, a conductive paste is applied to edge surfaces of the sintered body for forming external electrodes and is then dried. The sintered bodies provided with the conductive paste are aligned in an oven, and the conductive paste is then fired, whereby the external electrodes are formed on the individual sintered bodies. In addition, when necessary, a plating film is formed on the surface of the external electrode by firing the conductive paste.

In a conventional manufacturing method for a laminated ceramic electronic component, in order to form an external electrode, a process that must be performed includes the steps of aligning and holding sintered bodies by using an aligning tool, applying a conductive paste thereon, drying the conductive paste, removing the sintered bodies from the tool, placing the sintered bodies provided with the conductive paste in an oven, and firing the conductive paste. That is, a number of steps must be performed for forming the external electrodes, and hence, the method described above has problems in that the manufacturing process is complicated and the manufacturing cost is high.

In addition, since the internal electrode and the external electrode are formed in different steps, the reliability of electrical connection between the internal electrode and the external electrode may be degraded in some cases due to (1) the shrinkage of a portion of the internal electrode which is exposed on the external surface of the sintered ceramic body, (2) the precipitation of a glass frit in the conductive paste constituting the internal electrode, and (3) the generation of bubbles due to air trapped during application of the conductive paste.

SUMMARY OF THE INVENTION

In order to overcome the problems described above, preferred embodiments of the present invention provide a method for manufacturing a laminated ceramic electronic component which allows for easy formation of external electrodes, and in addition, significantly improves the reliability of electrical connection between the internal electrode and the external electrode. In addition, preferred embodiments of the present invention provide a laminated ceramic electronic component manufactured by the method described above.

In accordance with a preferred embodiment of the present invention, a method for manufacturing a laminated ceramic electronic component includes the steps of forming composite sheets each having a conductor and a ceramic layer provided at the side of the conductor on a carrier film, laminating the composite sheets with each other to obtain a first laminated body, cutting the first laminated body in the thickness direction thereof so as to divide the conductor to obtain a second laminated body having the conductor exposed on the cut surface, and firing the second laminated body to obtain a sintered ceramic body having an external electrode formed of the exposed conductor.

In the method for manufacturing the laminated ceramic electronic component according to this preferred embodiment, the laminating step preferably includes the steps of press-bonding the composite sheet formed on the carrier sheet to a lamination stage or to a composite sheet that was previously laminated, separating the carrier film from the composite sheet, and repeating the steps of press bonding and separating.

In the method for manufacturing the laminated ceramic electronic component according to this preferred embodiment, the laminating step also preferably includes the steps of separating the composite sheets from the carrier films, laminating the composite sheets with each other after separating, and compressing the laminated body in the thickness direction thereof.

In the method for manufacturing the laminated ceramic electronic component described above, the forming step preferably includes a step of printing the conductor and the ceramic layer at least two times so as to form a composite sheet including a plurality of conductor layers and a plurality of ceramic layers.

In the method for manufacturing the laminated ceramic electronic component described above, a planar configuration of the external electrode preferably includes an edge surface portion extending along the cut surface exposed by the cutting and a pair of bent portions bent inside from the cut surface at the both ends of the edge surface portion.

In the method for manufacturing the laminated ceramic electronic component described above, the cutting step preferably includes a step of cutting the first laminated body in a direction that is substantially perpendicular to the cut surface for forming a second laminated body having a substantially rectangular shape having a pair of edge surfaces and a pair of side surfaces connecting therewith, wherein the pair of bent portions are arranged to extend to the pair of side surfaces.

In the method for manufacturing the laminated ceramic electronic component described above, the conductor of a composite sheet disposed at the outermost layer of the first laminated body preferably has a bent portion extending inside from the edge surface portion of the external electrode which is exposed by the cutting.

In the method for manufacturing the laminated ceramic electronic component described above, the external electrode having the edge surface portion and the pair of bent portions is arranged such that the inner portion of the corner defined by the edge surface portion and the bent portion has a substantially round configuration.

In the method for manufacturing the laminated ceramic electronic component described above, the external electrode having the edge surface portion and the pair of bent portions is formed such that the outer portion of the corner defined by the edge surface portion and the bent portion has a substantially round configuration.

In the method for manufacturing the laminated ceramic electronic component described above, a width of the edge surface portion of the external electrode including the edge surface portion and the pair of bent portions increases toward an outer surface of the laminated body along the laminating direction.

In the method for manufacturing the laminated ceramic electronic component described above, widths of the pair of bent portions of the external electrode including the edge surface portion and the pair of bent portions increase toward an outer surface of the laminated body along the laminating direction.

In the method for manufacturing the laminated ceramic electronic component described above, the forming step preferably includes a step of forming a second conductor constituting an internal electrode at the same time when the conductor is formed.

In accordance with another preferred embodiment of the present invention, a laminated ceramic electronic component includes a sintered ceramic body formed by an integral firing technique for a laminated ceramic, and a plurality of external electrodes arranged so as to be exposed on the outer surface of the sintered ceramic body, wherein the outer surface of the external electrode is flush with the outer surface of the sintered ceramic body.

Other features, elements, steps, characteristics and advantages of the present invention will become more apparent from the following detailed description of preferred embodiments thereof with reference to the attached drawings.

BRIEF DESCRIPTION OF THE DRAWINGS

FIG. 2A is a perspective view showing a laminated inductor formed according to the first preferred embodiment of the present invention;

FIG. 2B is a schematic perspective view showing an inner structure of the laminated inductor according to the first preferred embodiment of the present invention;

FIG. 4 is a partially cutaway view showing another example of a mother composite sheet formed according to the first preferred embodiment of the present invention;

DETAILED DESCRIPTION OF PREFERRED EMBODIMENTS

Figure 1:
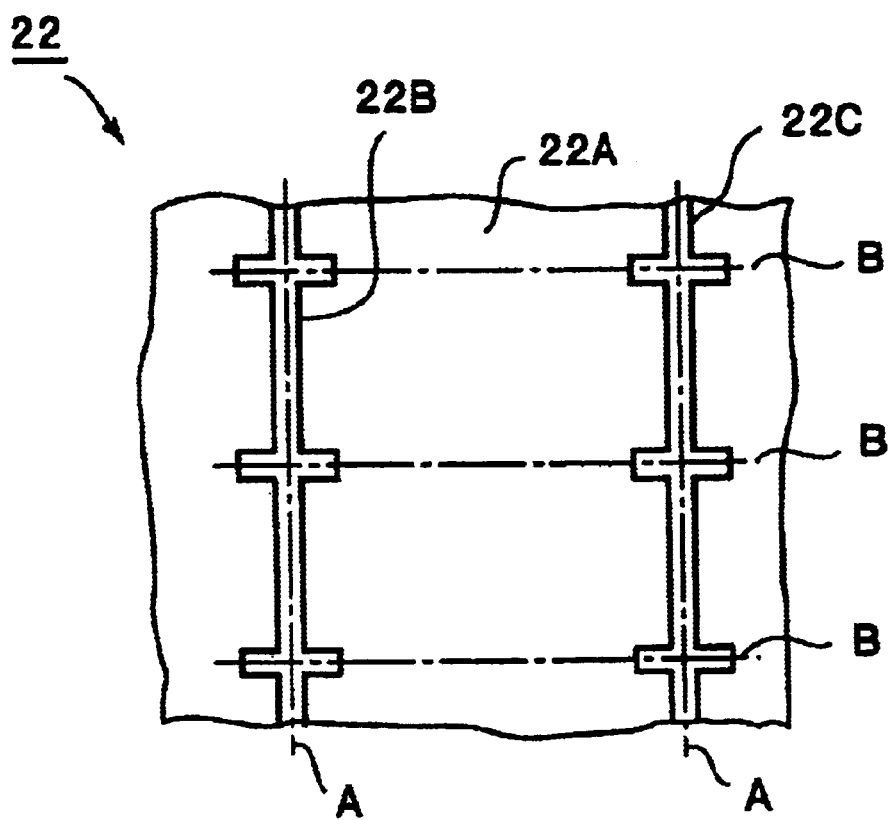
FIG. 1 is a partially cutaway view showing an example of a mother composite sheet formed according to a first preferred embodiment of the present invention.

Hereinafter, to facilitate understanding of the present invention, preferred embodiments of the present invention will be described with reference to the drawings.

A first preferred embodiment relates to a method for manufacturing a laminated inductor used as a laminated ceramic electronic component. In this preferred embodiment, a laminated inductor shown in FIGS. 2A and 2B is obtained. A laminated inductor 1 has external electrodes 3, 4 arranged to cover the two edge surfaces of a sintered ceramic body 2 that preferably has a substantially rectangular shape. In the sintered ceramic body 2, a coil conductor 5 is provided. The coil conductor 5 is preferably defined by internal electrodes 6 and 8 which are located at different heights and which are electrically connected with each other by a connecting electrode 7. The internal electrode 6 extends to an edge surface 2a of the sintered ceramic body 2 and is electrically connected with the external electrode 3 formed along the edge surface 2a. In addition, the internal electrode 8 is electrically connected with the external electrode 4 provided at the other edge surface 2b side of the sintered ceramic body 2.

One of the advantages of the laminated inductor 1 of this preferred embodiment is that the external electrodes 3, 4 are simultaneously fired with the sintered ceramic body 2. In addition, with respect to a planar configuration of the external electrode 3, the external electrode 3 has an edge surface portion 3a extending along the edge surface 2a and bent portions 3b, 3c at the both ends of the edge surface portion 3a, which extend in the direction away from the edge surface. In a manner similar to the external electrode 3, the external electrode 4 also has an edge surface portion 4a and bent portions 4b, 4c at the both ends thereof. The external surfaces of the external electrodes 3, 4 are flush with the external surfaces of the sintered ceramic body 2.

Next, a method for manufacturing the laminated inductor 1 will be described.

Figure 3:
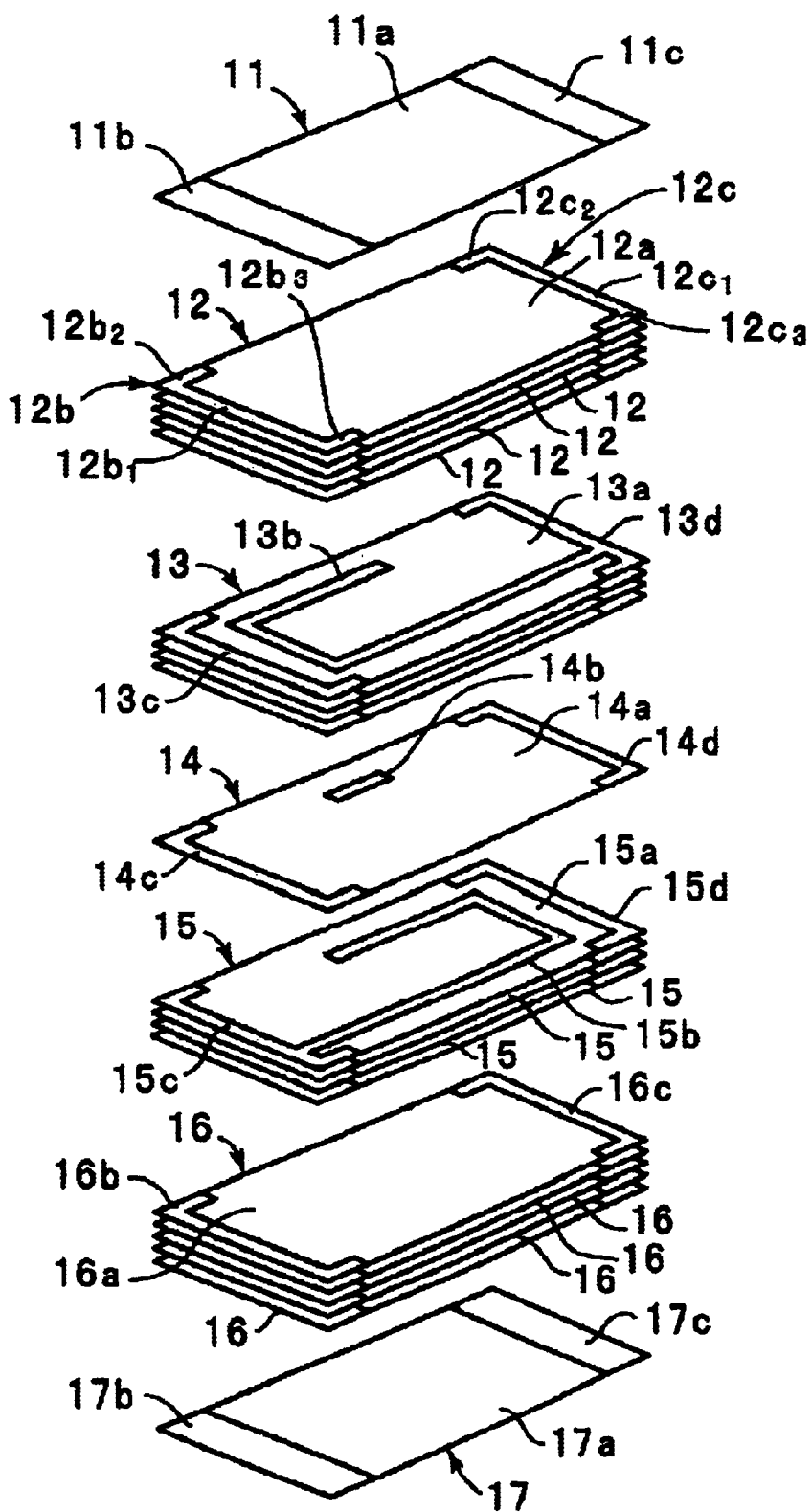
FIG. 3 is an exploded perspective view of a laminate (a second laminated body) defining one laminated inductor according to the first preferred embodiment of the present invention.

FIG. 3 is an exploded perspective view schematically showing individual elements constituting the laminated inductor 1 before it is assembled. In this preferred embodiment, a mother laminate is formed by laminating mother sheets, and after the mother laminate is formed, separate laminates each defining individual laminated inductors are obtained. However, in FIG. 3, in order to facilitate understanding of this preferred embodiment, sheets located at various positions for constituting one laminated inductor 1 are shown.

As shown in FIG. 3, a laminate forming the laminated inductor 1 is prepared by laminating composite sheets 11 to 17. The composite sheets 11, 17 constitute the outermost layers of the laminated inductor 1. The composite sheet 11 preferably includes a ceramic green sheet 11a and conductors 11b, 11c provided at the two ends thereof. That is, the ceramic green sheet 11a is disposed between the conductors 11b, 11c. The thicknesses of the conductors 11b, 11c are substantially equal to that of the ceramic green sheet 11a.

In the other composite sheets 12 to 16, conductors thereof have the same thicknesses as that of ceramic green sheet of the composite sheet and are connected with the sides of the ceramic green sheet. That is, the internal electrode described later is not formed on the ceramic green sheet but the conductors are disposed so as to penetrate therethrough in the laminating direction.

Under the ceramic green sheet 11a, a laminate including a plurality of composite sheets 12 for constituting the outer layer portion is arranged. In the composite sheet 12 conductors 12b, 12c are arranged at the two sides of a ceramic green sheet 12a. The conductors 12b and 12c each has a substantially U-shaped planar configuration. That is, the conductor 12b has an edge surface portion $12b_1$ extending along the edge surface of the sintered ceramic body, which corresponds to the edge surface of the external electrode 3, and has bent portions $12b_2$, $12b_3$ provided at the two ends of the edge surface portion $12b_1$. In a manner similar to the conductor 12b, the conductor 12c also has an edge surface portion $12c_1$ corresponding to the edge surface portion of the external electrode 4 and has bent portions $12c_2$, $12c_3$ provided at the two ends of the edge surface portion $12c_1$.

Under the composite sheet 12, a laminate including a plurality of composite sheets 13 is arranged. The composite sheet 13 preferably includes a ceramic green sheet 13a, an internal electrode 13b as a second conductor constituting a coil conductor, and conductors 13c, 13d constituting the external electrodes. The internal electrode 13b and the conductors 13c, 13d are arranged to penetrate through the ceramic green sheet 13a, that is, they are formed so as not to overlap the ceramic green sheet 13a. The conductors 13c, 13d are arranged so as to overlap the conductors 12b, 12c in the thickness direction, respectively, and are arranged so as to have the same shapes as those of the conductors 12b, 12c in a planar configuration.

In addition, the internal electrode 13b is connected to the conductor 13d. Since the internal electrode 13b defines a portion of the coil conductor, the internal electrode 13b preferably has a substantially U-shape so as to have an approximately ¾ turn winding.

Since the composite sheets 13 are laminated with each other, the internal electrodes 13b are laminated with each other, thereby forming a thick coil conductor portion. When the laminate of the internal electrodes 13b is fired in a firing step described below, the internal electrode 8 shown in FIG. 2 is formed.

Under the composite sheets 13, a laminate including a composite sheet 14 is arranged. The composite sheet 14 preferably includes a ceramic green sheet 14a and an internal electrode 14b located therein constituting a connecting electrode. In addition, at the two sides of the ceramic green sheet 14a, conductors 14c, 14d are provided. The conductors 14c, 14d are arranged so as to have substantially the same planar shapes as those of the conductors 12b, 12c, 13c, and 13d. The internal electrode 14b defining the connecting electrode is arranged so as to overlap the internal electrode 13b in the vicinity of an end thereof, constituting the upper coil conductor, when they are laminated with each other.

Under the composite sheet 14, a laminate including a plurality of composite sheets 15 is disposed. The composite sheet 15 preferably includes a ceramic green sheet 15a, an internal electrode 15b constituting a coil conductor, and conductors 15c, 15d. Similarly to the internal electrode 13b, the internal electrode 15b preferably has a substantially U-shape for forming a coil conductor having an approximately ¾ turn winding. In addition, the internal electrode 15b is connected to the conductor 15c. Since the internal electrode 15b is arranged so as to penetrate through the ceramic green sheet 15a, and the plurality of composite sheets 15 defines a laminate, the laminate defines a thick coil conductor portion. After the composite sheets 15 are laminated with each other, the bottom surface of the internal electrode 14b defining the connecting electrode of the composite sheet 14 is brought into contact with the upper surface of the internal electrode 15b of the uppermost composite sheet 15.

Accordingly, the upper and the lower coil conductors are electrically connected with each other via the internal electrode 14b. Further, the conductors 15c, 15d have the same plan shapes as those of the conductors 12b, 12c.

Under the plurality of composite sheets 15, a laminate including a plurality of composite sheets 16 is arranged. The composite sheet 16 preferably has the same structure as that of the composite sheet 12. That is, conductors 16b, 16c are arranged at the two sides of a ceramic green sheet 16a. In addition, the lowermost composite sheet 17 has the same structure as that of the composite sheet 11. That is, a ceramic green sheet 17a is disposed between conductors 17b, 17c.

As can be seen from FIG. 3, the conductors 11b, 11c constituting the composite sheet 11 are arranged so that the widths thereof, i.e., the widths in the direction from the conductor 11b to the conductor 11c, are larger than those of the conductors $12b_1$, $12c_1$, respectively. In a manner similar to that of the conductors 11b, 11c, the conductors 17b, 17c constituting the composite sheet 17 are formed. Upper and lower folding portions are provided in the external electrodes 3, 4 and the external electrodes of the laminated inductor 1 exposed at the top and the bottom surfaces thereof have larger areas. Because of this arrangement, the process of mounting the inductor is easily performed.

When the laminated inductor 1 of this preferred embodiment is manufactured, the mother composite sheets are laminated with each other, and the laminate thus formed is cut in the thickness direction thereof, whereby the laminate including the composite sheets 11 to 17 shown in FIG. 3 is obtained. Subsequently, the laminate defining one laminated inductor is fired, whereby the laminated inductor 1 is obtained.

Accordingly, complicated steps are not additionally required to form the external electrodes, and when only the laminate forming individual laminated inductor is fired, firing of the ceramic, firing of the internal electrodes 13b, 14b, and 15b constituting the coil conductor, and firing of the external electrodes can be preformed.

Next, steps of forming the laminate using the composite sheets will be described in more detail. One of the advantages of various preferred embodiments of the present invention is that the conductors for forming the external electrodes are formed at the stage in which the mother laminate is formed, and the conductors are divided to define the external electrodes when the mother laminate is cut into individual laminated ceramic components.

FIG. 4 is a partially cutaway plan view showing a mother composite sheet 21 forming the composite sheet 11 used as the outermost layer described above. In the mother composite sheet 21, the composite sheets 11 are connected to each other in a matrix. That is, a plurality of mother conductors 21B, 21C extend substantially parallel to each other, and the mother ceramic green sheet 21A is disposed therebetween. Chain lines A, B indicate positions at which the mother laminate is cut. That is, an area surrounded by the chain lines A and B that are substantially perpendicular to each other corresponds to the composite sheet 11 described above. Accordingly, each width of the mother conductors 21B, 21C is approximately two times each width of the conductors 11b, 11c.

In addition, a mother composite sheet defining the composite sheet 17 described above is preferably substantially equivalent to the mother composite sheet 21.

FIG. 1 is a partially cutaway plan view showing a mother composite sheet 22 forming the composite sheet 12. In the mother composite sheet 22, mother ceramic green sheets 22A are disposed between a plurality of mother conductors 22B, 22C. Similarly to the case shown in FIG. 4, chain lines A, B indicate positions at which the mother laminate is divided into individual laminate-defining laminated inductor. That is, when the mother laminate is divided along the chain lines A and B, the mother conductors 22B and 22C are divided so as to finally form the conductors 12b and 12c, respectively.

Figure 5A:
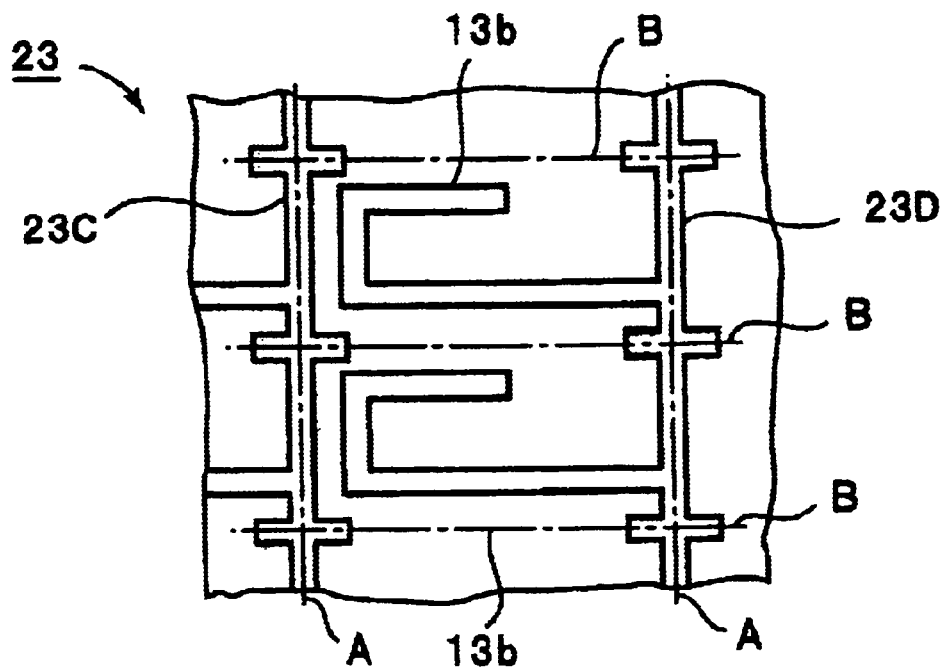
FIG. 5A is a partially cutaway view showing another example of a mother composite sheet for forming a laminated inductor according to the first preferred embodiment of the present invention.
Figure 5B:
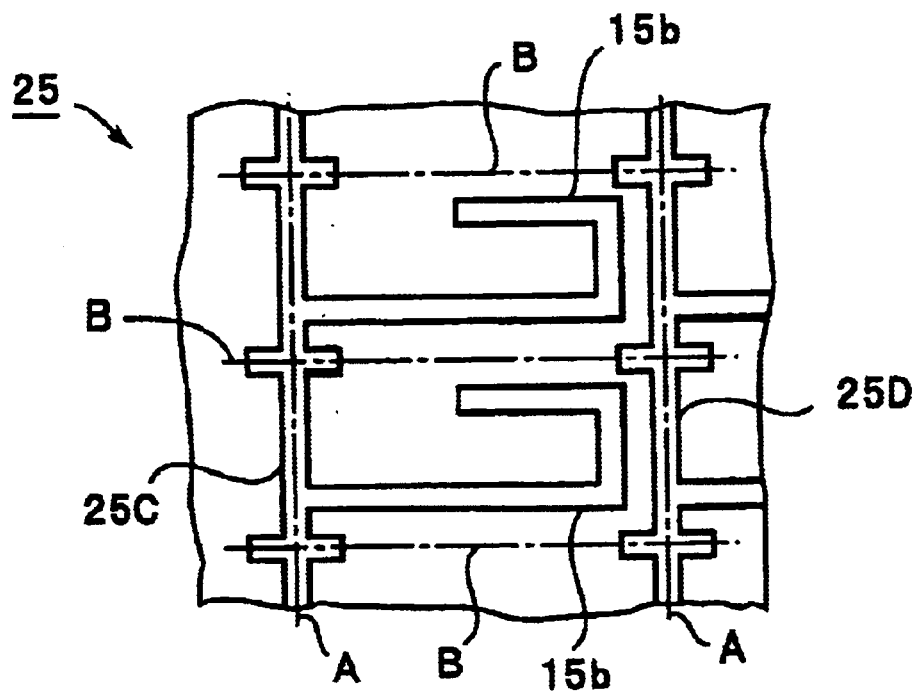
FIG. 5B is a partially cutaway view showing another example of a mother composite sheet for forming a laminated inductor according to the first preferred embodiment of the present invention.

FIGS. 5A and 5B are partially cutaway plan views showing mother composite sheets 23 and 25 defining the composite sheets 13 and 15, respectively. Chain lines A and B indicate positions at which the mother laminate is to be divided, similarly to the chain lines A and B shown in FIG. 4.

Areas surrounded by the chain lines A and B correspond to the areas at which the individual composite sheets 13 and 15 are formed.

Accordingly, in the areas at which the individual composite sheets 13 and 15 are formed, the internal electrodes 13b and 15b are formed, respectively. In addition, after the mother laminates are divided, the mother conductors 23C, 23D, 25C, and 25D define the conductors 13c, 13d, 15c, and 15d described above, respectively.

Figure 6:
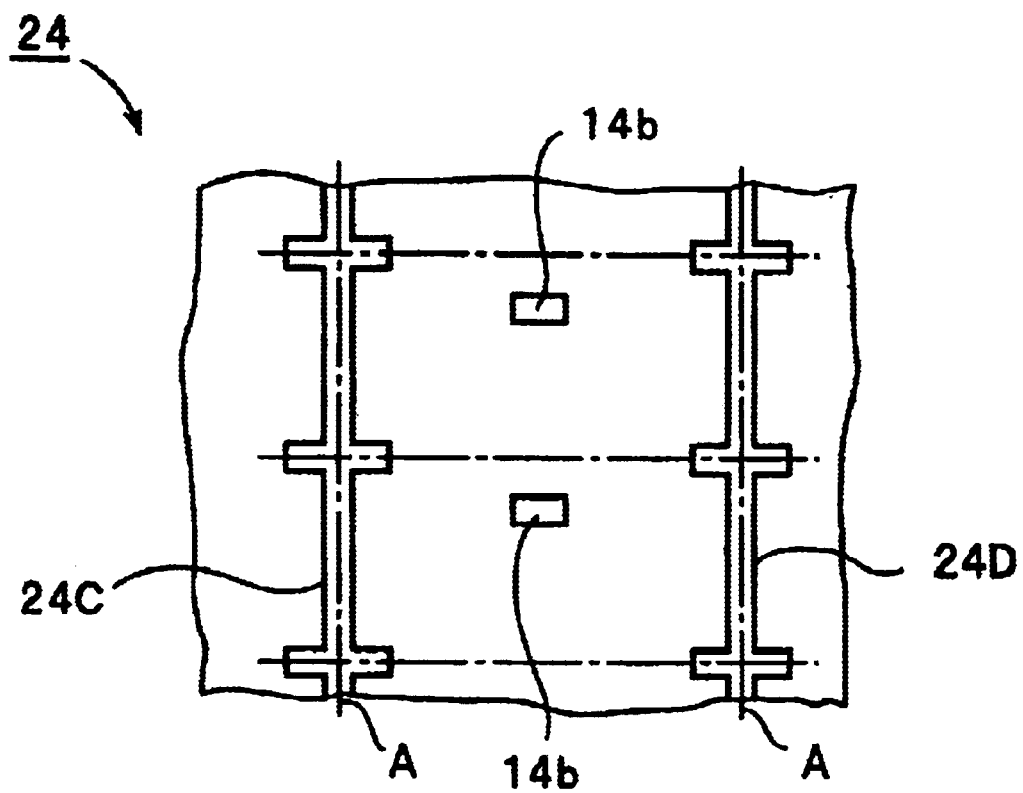
FIG. 6 is a partially cutaway view showing another example of a mother composite sheet for forming a laminated inductor according to the first preferred embodiment of the present invention.

FIG. 6 is a partially cutaway plan view showing mother composite sheet 24 forming the composite sheet 14. In an area surrounded by chain lines A and B, the internal electrode 14b is formed as the connecting electrode. In addition, the mother conductors 24C and 24D are finally divided at the positions indicated by the chain lines A and B so as to form the conductors 14c and 14d.

Referring to FIGS. 7 to 11, particular laminating steps will be described.

Figure 7A:
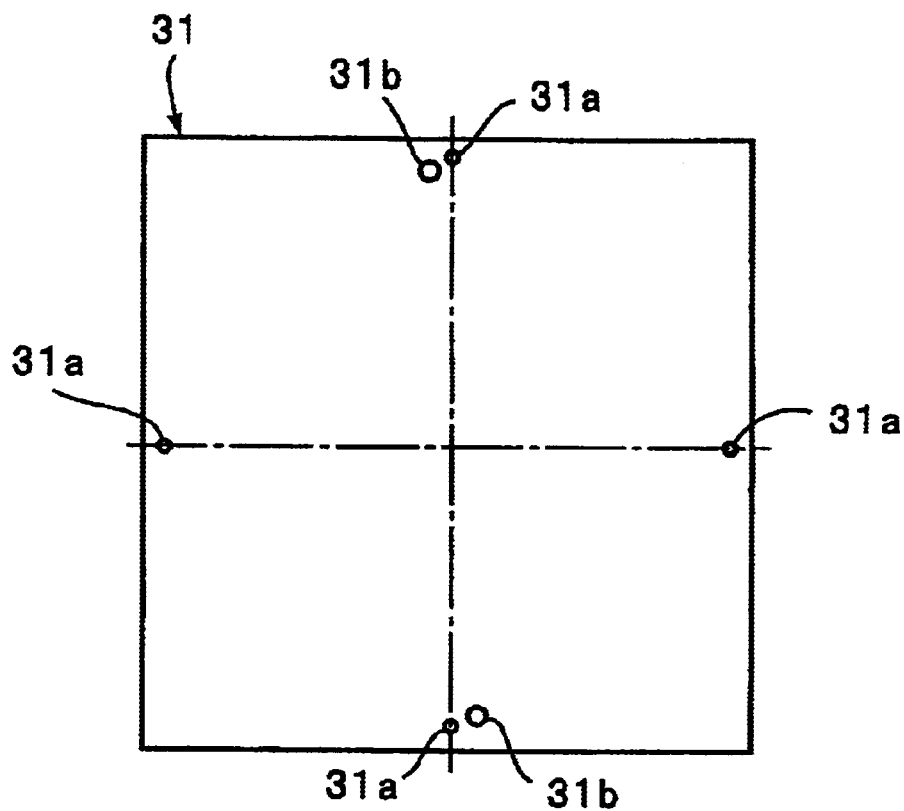
FIG. 7A is a plan view showing a carrier film used for manufacturing a laminated inductor according to the first preferred embodiment of the present invention.

In the laminating step, a carrier film 31 shown in FIG. 7A is prepared. The carrier film 31 may be formed of a film of an appropriate synthetic resin, such as a polyethylene terephthalate film, or other suitable material.

In the carrier film 31, a plurality of positioning holes 31a are formed for printing the conductors and ceramic green sheets. In addition, a plurality of standard holes 31b for lamination are formed at positions corresponding to the positioning holes 31a for positioning the composite sheets when laminated with each other.

Figure 7B:
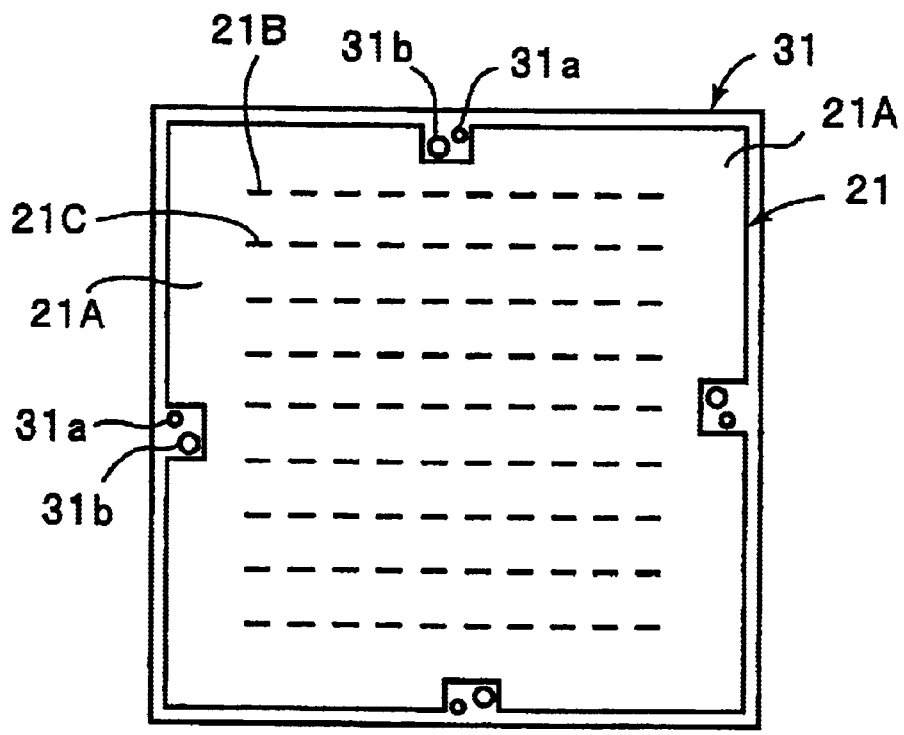
FIG. 7B is a plan view showing a composite sheet formed on the carrier film used for manufacturing the laminated inductor according to the first preferred embodiment of the present invention.
Figure 8A:
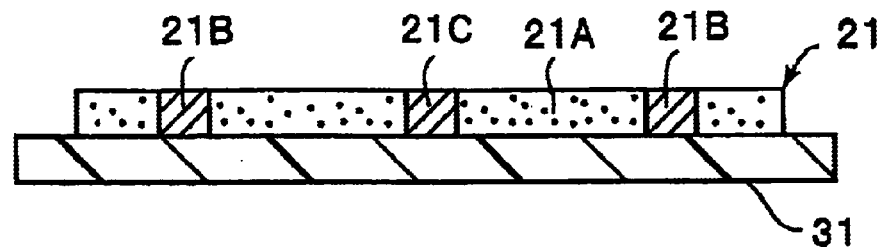
FIG. 8A is a cross-sectional view showing an outermost mother composite sheet formed on a carrier film according to the first preferred embodiment of the present invention.

On the carrier film 31, the mother ceramic green sheet 21A is laminated which defines the outermost layer. As schematically shown in FIGS. 7B and 8A, in the mother composite sheet 21, the mother ceramic green sheets 21A are each disposed between the mother conductors 21B and 21C. The structure described above can be formed by a step of performing pattern printing of the mother ceramic green sheet 21A on the carrier film 31 and by a subsequent step of performing pattern printing of a conductive paste for forming the mother conductors 21B and 21C so as not to overlap the ceramic green sheet 21A. Alternatively, after the mother conductors 21B and 21C are formed by printing, the ceramic green sheet 21A may be formed by printing so as not to overlap the conductors 21B and 21C.

Accordingly, the mother conductors 21B and 21C are formed so as to penetrate the composite sheet 21 from the top surface to the bottom surface thereof (see FIG. 8A).

Figure 8B:
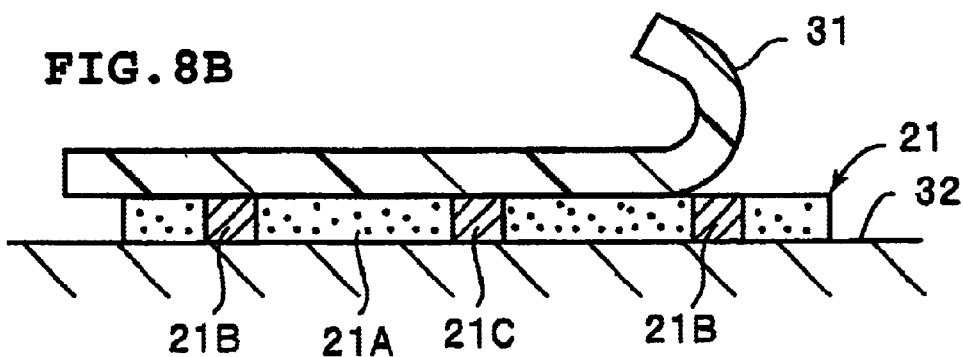
FIG. 8B is a cross-sectional view illustrating a step of laminating the mother composite sheet on a lamination stage according to the first preferred embodiment of the present invention.

Subsequently, as shown in FIG. 8B, the mother composite sheet 21 supported on the carrier film 31 is placed on a lamination stage 32 so that the mother composite sheet 21 is brought into contact therewith. Next, pressure is applied to the backside of the carrier film 31, and the mother composite sheet 21 is press-bonded to the lamination stage 32. The carrier film 31 is then separated as shown in FIG. 8B.

Figure 9A:
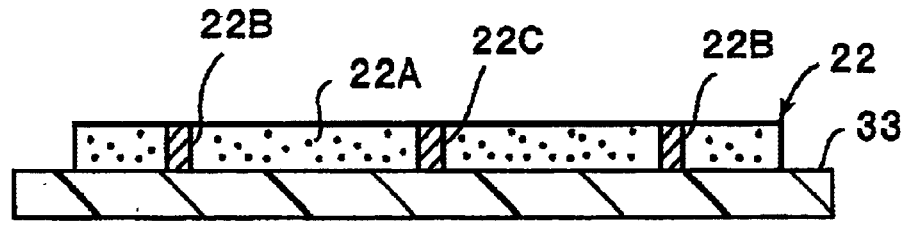
FIG. 9A is a cross-sectional view showing a mother composite sheet formed on a carrier film, which is to be formed on the outermost layer according to the first preferred embodiment of the present invention.

Next, as shown in FIG. 9A, the mother composite sheet 22 is formed on a carrier film 33. In the mother composite sheet 22, the mother conductors 22B and 22C extend substantially parallel with each other, and the mother ceramic green sheet 22A is disposed between the mother conductors 22B and 22C (see FIG. 1).

The mother sheet 22 can be formed in a manner similar to that for the mother composite sheet 21.

Figure 9B:
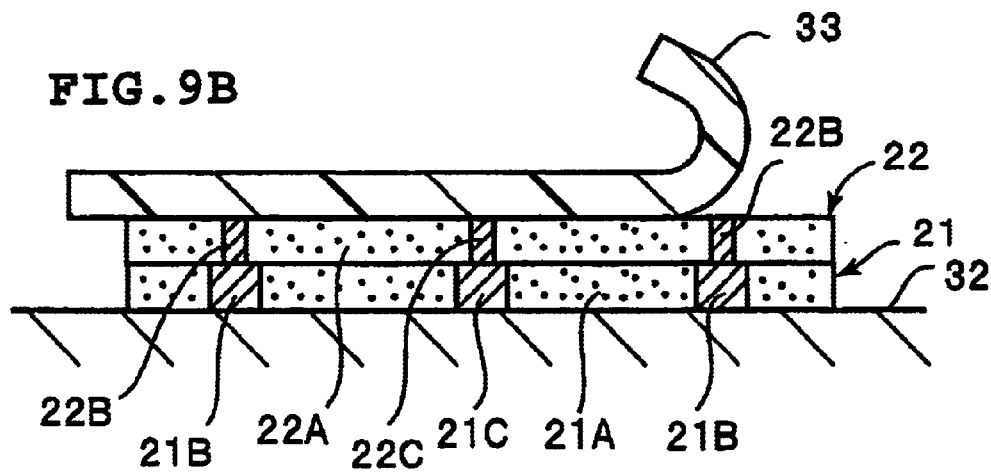
FIG. 9B is a cross-sectional view illustrating a step of laminating the mother composite sheet in FIG. 9A according to the first preferred embodiment of the present invention.

Subsequently, the mother composite sheet 22 supported on the carrier film 33 is placed on the mother composite sheet 21 on the lamination stage 32 so that the mother composite sheet 22 is brought into contact with the mother composite sheet 21. Next, the carrier film 33 is compressed downward and is then separated as shown in FIG. 9B.

Figure 10:
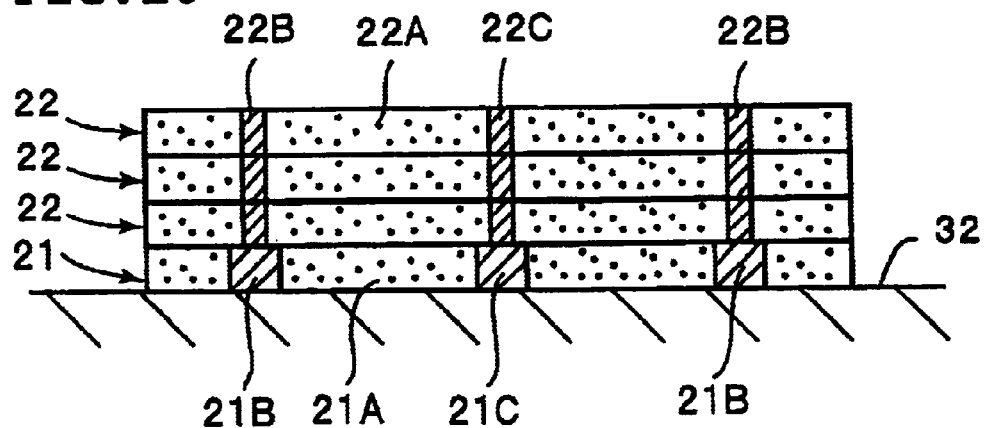
FIG. 10 is a cross-sectional view illustrating a step of laminating a plurality of mother composite sheets according to the first preferred embodiment of the present invention.

As described above, the mother composite sheets 22 formed on the carrier films are prepared and are then laminated one on the other in accordance with the method described above, i.e., a so-called transfer method, whereby, as shown in FIG. 10, a plurality of mother composite sheets 22 are formed on the mother composite sheet 21.

Figure 11:
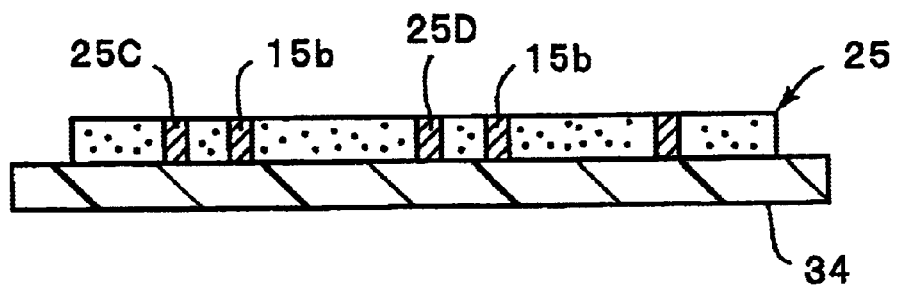
FIG. 11 is a cross-sectional view illustrating a step of forming a mother composite sheet having an internal electrode for forming a coil conductor according to the first preferred embodiment of the present invention.

Next, as shown in FIG. 11, the mother composite sheet 25 described above is formed on a carrier film 34. The formation of the composite sheet 25 is performed in a manner similar to that for the composite sheet 21 and 22.

In accordance with the transfer method, the mother composite sheet 25 formed on the carrier film 34 is laminated on the mother composite sheet 22 shown in FIG. 10. By repeating this step described above at least two times, the mother composite sheets 25 for forming the composite sheet 15 shown in FIG. 3 can be laminated with each other.

Subsequently, the mother composite sheet 24 shown in FIG. 6 is laminated by the same transfer method as described above. In addition, the mother composite sheets 23 shown in FIG. 5A, the mother composite sheets 22 described above, and the mother composite sheet 21 are sequentially laminated. Thus, a mother laminate can be obtained.

Next, when the mother laminate thus obtained is cut at the positions indicated by the chain lines A and B described above, laminates can be obtained each forming one laminated inductor. In other words, the laminate shown by an exploded perspective view in FIG. 3 is obtained.

Accordingly, by dividing the mother laminate described above at the positions indicated by the chain lines A and B, the mother conductors 21B, 21C, 22B, 22C, are divided, whereby the conductors 11b, 11c, 12b, 12c, 13c, 13d, 14c, 14d, 15c, 15d, 16b, 16c, 17b, and 17c constituting the external electrodes are formed.

In other words, the individual conductors 11b, 11c, and other elements are exposed on the cut surfaces.

By firing the laminates thus formed each forming one laminated inductor, the laminated inductors 1 shown in FIG. 2 are obtained. That is, when the ceramic is fired, the internal electrodes 6 to 8 constituting the coil conductor and individual conductors 11b, 11c, and other elements constituting the external electrodes 3 and 4 can be simultaneously fired.

Consequently, according to the manufacturing method in this preferred embodiment, after the sintered ceramic body is obtained, a number of steps of forming the external electrodes are not required, and hence, the process for manufacturing the laminated inductors 1 is significantly simplified.

In addition, since the conductors constituting the internal electrodes 6, 8 and the external electrodes are formed in the same step, the reliability of electrical connection between the external electrode and the internal electrode can also be significantly improved.

Furthermore, in the manufacturing method in this preferred embodiment, the internal electrodes 13b, 15b having substantially the same thicknesses as those of the ceramic green sheets are used for constituting the coil conductor 5, and in addition, a plurality of internal electrodes 13b and a plurality of internal electrodes 15b form laminates, respectively, such that a considerably thick coil conductor can be formed. As a result, an increase in inductance and a decrease in a DC resistance can be achieved.

Figure 12:
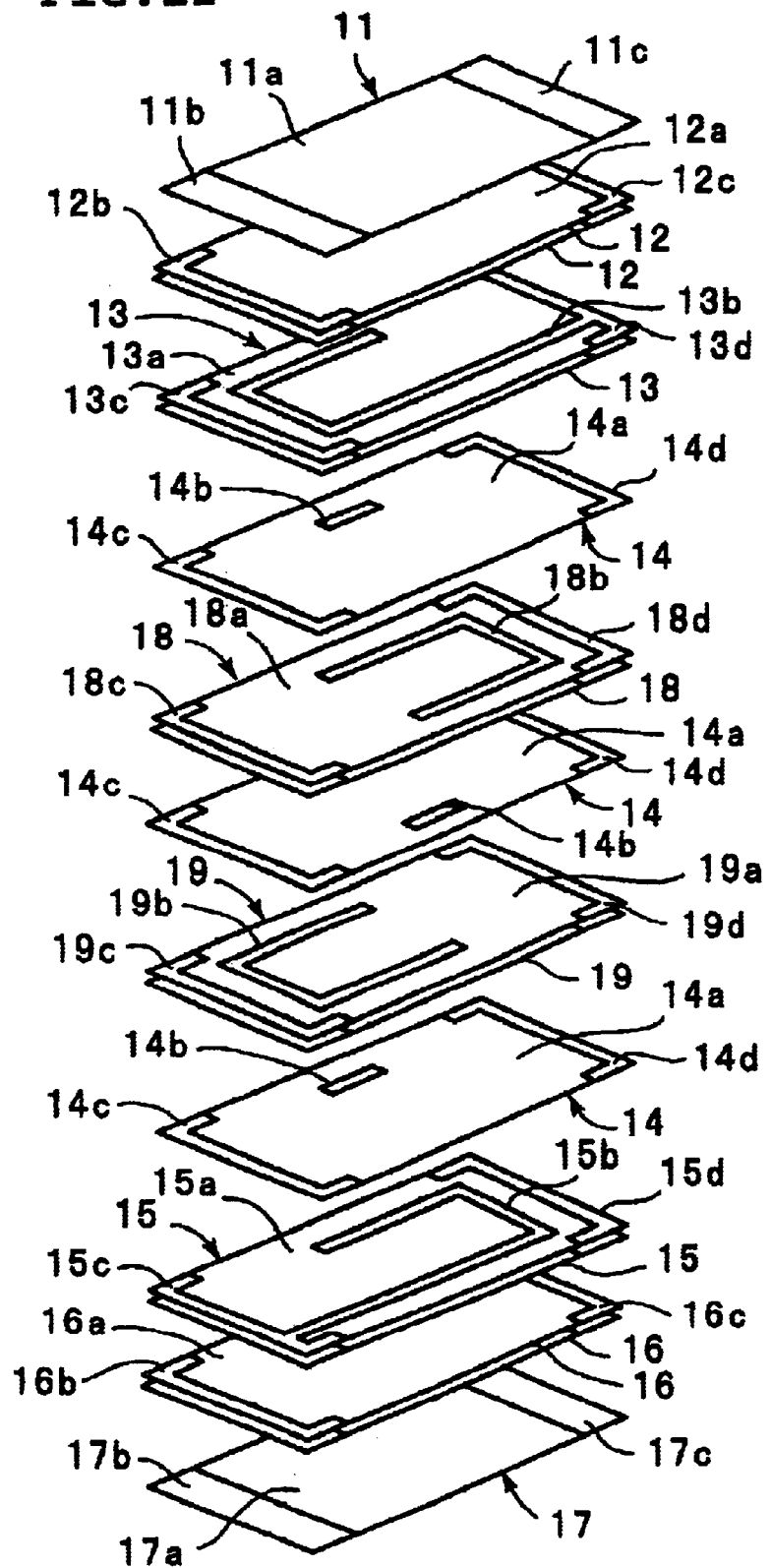
FIG. 12 is an exploded perspective view illustrating a manufacturing method for a laminated inductor in a modified example of the first preferred embodiment of the present invention.

In the first preferred embodiment, by laminating the composite sheets 11 to 17, the coil conductor 5 having an approximately 1.5 turn winding is produced. However, in the laminated inductor 1 of the first preferred embodiment, by increasing the type of composite sheet, a laminated inductor having an approximate 2 turn winding or more can be easily produced. For example, as shown in FIG. 12, in addition to the composite sheets 11 to 17, by forming a laminate containing composite sheets 18, 19, and 14, the number of turns of the coil conductor can be increased.

In this structure, the composite sheet 18 has a ceramic green sheet 18a, an internal electrode 18b constituting the coil conductor, and conductors 18c, 18d. The conductors 18c, 18d preferably have substantially the same plan shape as those of the conductors 12b, 12c.

In addition, the internal electrode 18b is preferably a substantially U-shaped electrode, and one end thereof is electrically connected to an internal electrode 14b of a composite sheet 14 located above the composite sheet 18. The other end of the internal electrode 18b is electrically connected to an internal electrode 14b of a composite sheet 14 located thereunder. In addition, the composite sheet 19 preferably has a shape that is substantially equivalent to that of the composite sheet 18. However, the composite sheet 19 preferably has a shape obtained by rotating the shape of the composite sheet 18 by approximately 180° in the plane surface. The composite sheet 19 has a ceramic green sheet 19a, an internal electrode 19b constituting the coil conductor, and conductors 19c, 19d.

One end of the internal electrode 19b is electrically connected to the internal electrode 18b located above via the internal electrode 14b used as a connecting electrode. The other end of the internal electrode 19b is electrically connected to an internal electrode 14b of a composite sheet 14 located thereunder.

Accordingly, when a laminate including the composite sheets 18, 14, 19, and 14 is additionally formed in the laminate described in the first preferred embodiment, a laminated inductor can be easily formed which includes a coil conductor having approximately 2 turn windings or more. In addition, by increasing the laminate including the composite sheets 18, 14, 19, and 14 in accordance with the winding number, a significantly larger inductance can be easily obtained.

Figure 13A:
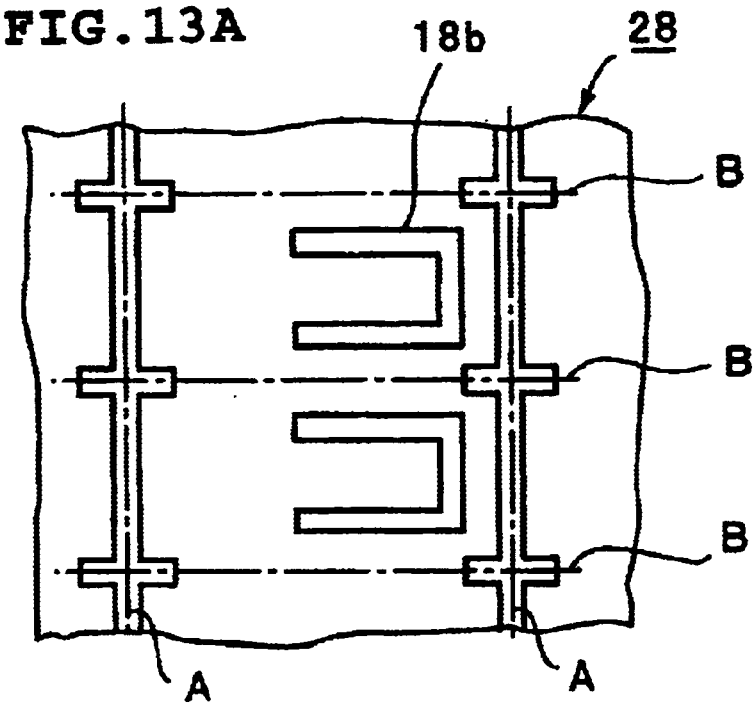
FIG. 13A is a plan view illustrating a mother composite sheet for use in manufacturing in the modified example of the first preferred embodiment of the present invention the first Embodiment 1.
Figure 13B:
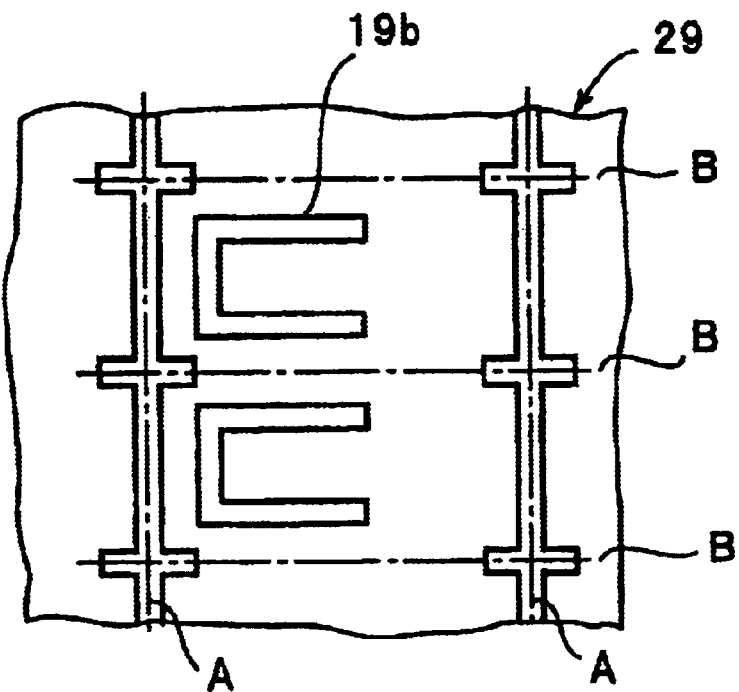
FIG. 13B is a plan view illustrating the mother composite sheet for use in manufacturing in the modified example of the first preferred embodiment of the present invention.
Figure 14:
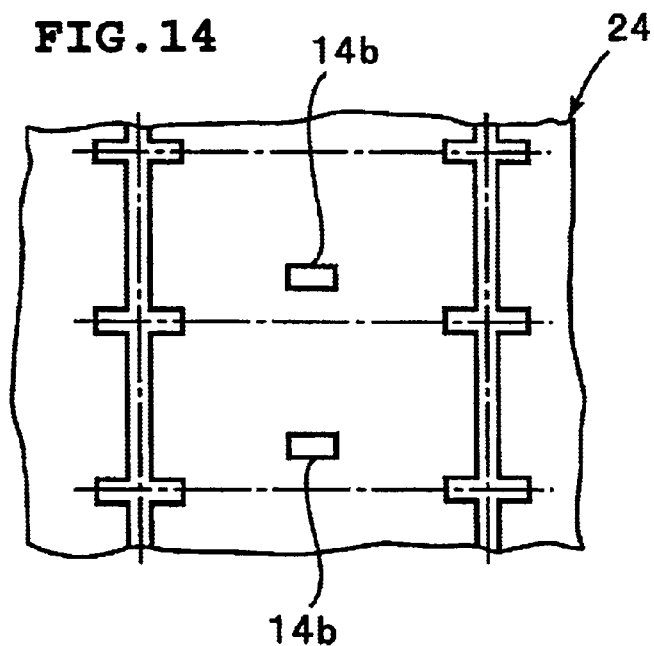
FIG. 14 is a partially cutaway view illustrating a mother composite sheet for use in manufacturing of the laminated inductor of the modified example shown in FIG. 12.

FIGS. 13A, 13B, and 14 are partially cutaway plan views showing mother composite sheets 28, 29, and 24 for forming the composite sheets 18, 19, and 14, respectively.

Figure 15A:
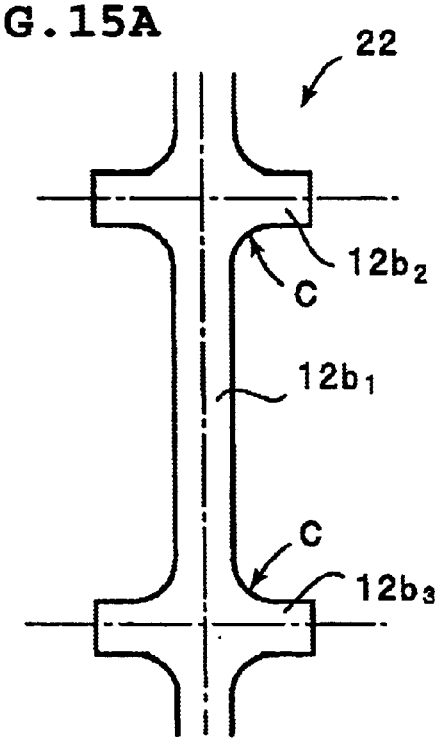
FIG. 15A is an enlarged plan view illustrating a mother composite sheet used in a modified example of the first preferred embodiment of the present invention.
Figure 15B:
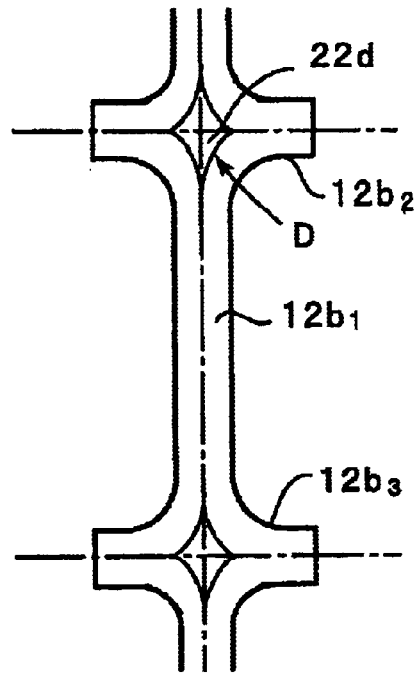
FIG. 15B is an enlarged plan view illustrating a mother composite sheet used in a modified example of the first preferred embodiment of the present invention.

FIGS. 15A and 15B are schematic plan views each illustrating a modified example of the method for manufacturing the laminated inductor in the first preferred embodiment.

As shown in FIG. 1, in the mother composite sheet 22, the mother conductors 22B and 22C constituting the external electrodes are arranged so as to form the conductors 12b and 12c having an approximately U-shape in plan, respectively, after the cutting step is performed. In this case, in the conductor 12b, the bent portions 12b$_2$ and 12b$_3$ are formed at the two ends of the edge surface portion 12b$_1$ so as to be substantially perpendicular thereto. In a manner similar to the above, the bent portions 12c$_2$ and 12c$_3$ are formed at the two ends of the edge surface portion 12c$_1$ so as to be substantially perpendicular thereto. However, as shown by an enlarged view in FIG. 15A, for example, after the conductor 22B of the mother composite sheet 22 is cut along cutting lines A and B, inner peripheries thereof at the corners defined by the edge surface portion 12b$_1$ and the bent portions 12b$_2$, 12b$_3$ may have substantially round shapes, respectively, as shown by arrows C.

As described above, when the conductor is formed so as to have the substantially round inner portion at the corners defined by the edge surface portion 12b$_1$ and the bent portions 12b$_2$, 12b$_3$, in a sintered ceramic body finally obtained, ridgelines defined by the edge surface and the side surfaces are formed so as to be substantially round in the areas at which the external electrodes 3 and 4 are formed. That is, in addition to the mother composite sheet 22, when the respective mother composite sheets constituting the other composite sheets 13 to 16 are formed so that the conductors have substantially round inner portions thereof at the corners formed by the edge surface portions and the bent portions, a sintered ceramic body can be formed having substantially round ridgelines defined by the edge surfaces and the side surfaces.

Accordingly, for example, when barrel polishing is performed, the surface of the external electrode can be easily formed so as to be substantially round along the ridgelines defined by the edge surfaces and the side surfaces of the sintered ceramic body. As a result, chipping of the laminated inductors caused by collision therebetween in mounting or other processes is eliminated.

Similarly to the above, as shown in FIG. 15B, the outer portions of the conductor at the corners defined by the edge surface portions 12b$_1$ and the bent portions 12b$_2$, 12b$_3$ may also have substantially round shapes as shown by an arrow D. In the case described above, in the mother green sheet 22, an air space 22d may be formed between the composition sheets 12 adjacent to each other, or a ceramic green sheet may be filled in the air space 22d. In the case in which the ceramic green sheet is filled in the air space 22d, the ceramic green sheet or a ceramic filled in the air space 22d may be removed when barrel polishing is performed or after the mother green sheet is divided.

As shown in FIG. 15B, when the outer portions of the corners defined by the edge surface 12b$_1$ and the bent portions 12b$_2$, 12b$_3$ are substantially round, the amount polished by barrel polishing can be greatly reduced.

Figure 16:
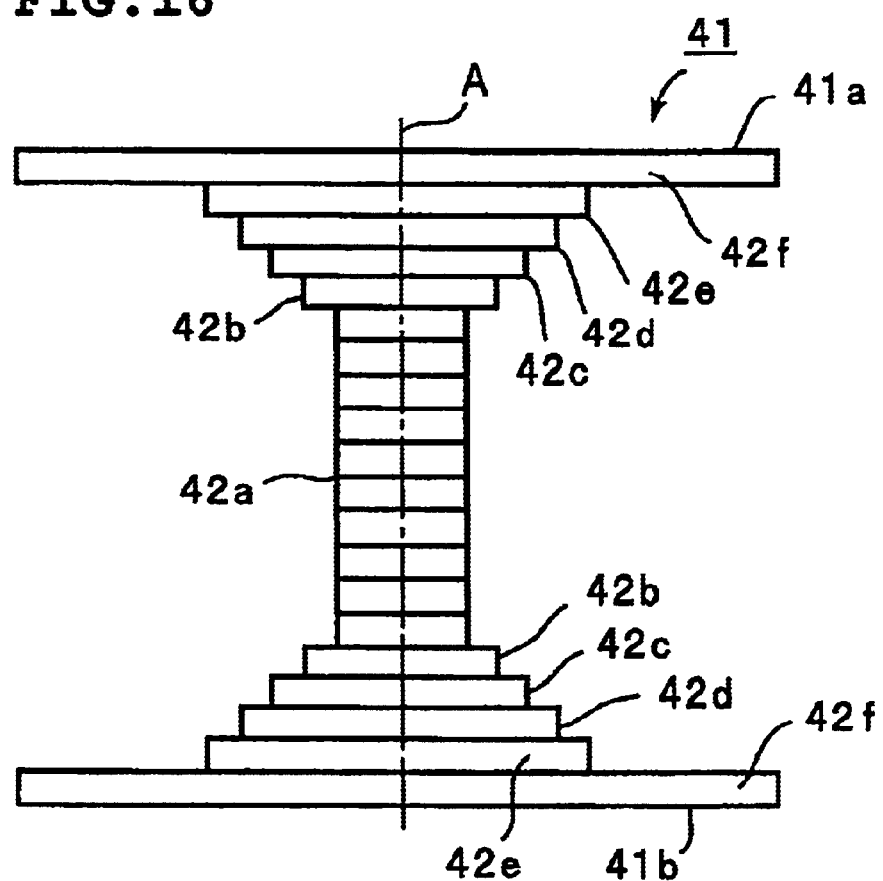
FIG. 16 is a cross-sectional view illustrating a mother laminate for use in manufacturing of a laminated inductor in another modified example of the first preferred embodiment of the present invention.

In the modified examples shown in FIGS. 15A and 15B, the substantially round shapes are preferably formed along the ridgelines defined by the edge surfaces and the side surfaces of the laminated inductor which is finally obtained, and in addition, substantially round shapes may also be formed along the ridgelines defined by the edge surfaces and the top surface and the bottom surface of the inductor. In the case described above, as schematically shown by a cross-sectional front view in FIG. 16, in a mother laminate 41 having mother conductors 42a to 42f constituting an external electrode, the width of the mother conductor may be increased along the direction from the approximate central portion of the laminate to the top surface 41a and to the bottom surface 41b in the thickness direction (laminating direction). Accordingly, by firing each laminate obtained by cutting the mother laminate 41 along a chain line A and a chain line B (not shown) followed by barrel polishing, the surface of the external electrodes can be easily formed so as to have substantially round shapes along the ridgelines formed by the edge surfaces and the top surface and bottom surface of the sintered body.

Figure 17:
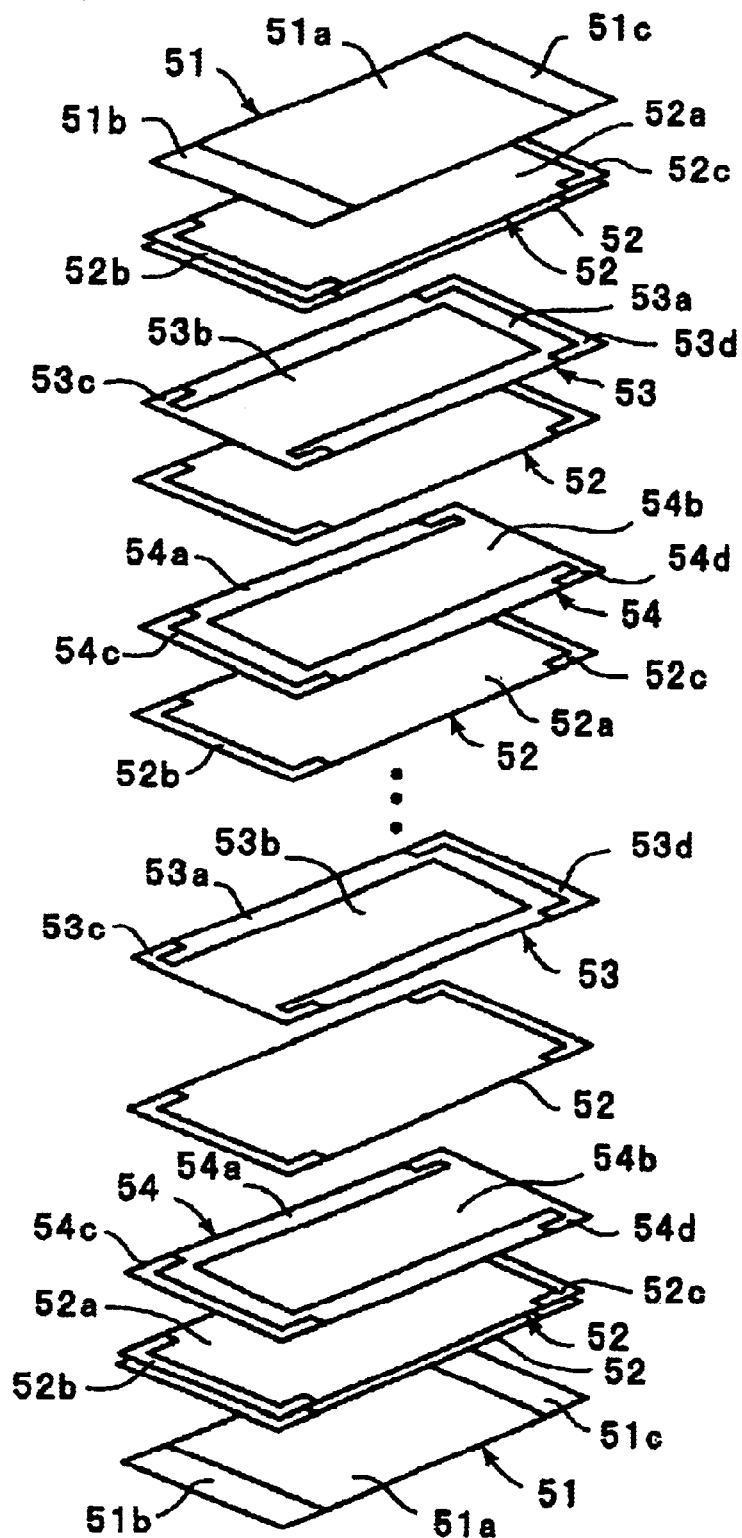
FIG. 17 is an exploded perspective view illustrating a manufacturing method for a laminated capacitor according to a second preferred embodiment of the present invention.

Referring to FIGS. 17 to 19, a method for manufacturing a laminated capacitor will be described according to a second preferred embodiment of the present invention.

In the first preferred embodiment, the method for manufacturing the laminated inductor is described. However, in addition to the laminated inductor, the present invention can be applied to other various laminated ceramic electronic components, such as a laminated capacitor, a laminated thermistor, and a laminated piezoelectric resonator, and other devices.

FIG. 17 is an exploded perspective view of a laminated capacitor for illustrating a method for manufacturing a laminated capacitor. Similarly to the FIG. 3, FIG. 17 is a perspective view schematically showing individual elements constituting the laminated capacitor before they are fired. In this preferred embodiment, a laminate including composite sheets 51 to 54 is formed. That is, the composite sheets 51 and 51 are formed at the outermost positions of the laminate, and the composite sheets 51 and 51 are formed to preferably have substantially the same structures as those of the composite sheets 11 and 17 in the first preferred embodiment. That is, the composite sheet 51 includes a ceramic green sheet 51a and conductors 51b and 51c provided at the two sides thereof for defining external electrodes.

In addition, a ceramic green sheet 52a is formed preferably to have substantially the same structure as that of the ceramic green sheet 12a in the first preferred embodiment. That is, the composite sheet 52 preferably includes the ceramic green sheet 52a and conductors 52b and 52c provided at the two sides thereof for defining the external electrodes.

In this preferred embodiment, in order to form a capacitor, the composite sheet 53 and 54 are laminated repeatedly with each other with the composite sheet 52 provided therebetween. The composite 53 preferably includes a ceramic green sheet 53a, an internal electrode 53b for obtaining capacitance, and conductors 53c and 53d for constituting the external electrodes. Similarly to the above, the composite sheet 54 preferably includes a ceramic green sheet 54a, an internal electrode 54b for obtaining static capacitance, and conductors 54c and 54d for constituting the external electrodes.

In the composite sheet 53, the ceramic green sheet 53a is arranged so as to be in contact with the sides of the internal electrode 53b and the conductors 53c and 53d. In a manner similar to the above, in the composition sheet 54, the ceramic green sheet 54a is arranged so as to be in contact with the sides of the internal electrode 54b and the conductors 54c and 54d. In other words, the internal electrode 53b is arranged so as to penetrate from the top surface to the bottom surface of the ceramic green sheet 53a and is disposed so as to be in contact with the side thereof. The internal electrode 54b has the same structure as that of the internal electrode 53b. In addition, the conductors 53c, 53d are also arranged so as to penetrate from the top surface to the bottom surface of the ceramic green sheet 53a. The conductors 54d, 54d have structures similar to those of the conductors 53c, 53d.

Accordingly, when the composite sheets 53 and 54 located at the upper side and at the lower side, respectively, are directly laminated with each other, the internal electrode 53b and the internal electrode 54b are short-circuited, and hence, the composite sheet 52 is provided between the composite sheets 53 and 54.

Figure 18A:
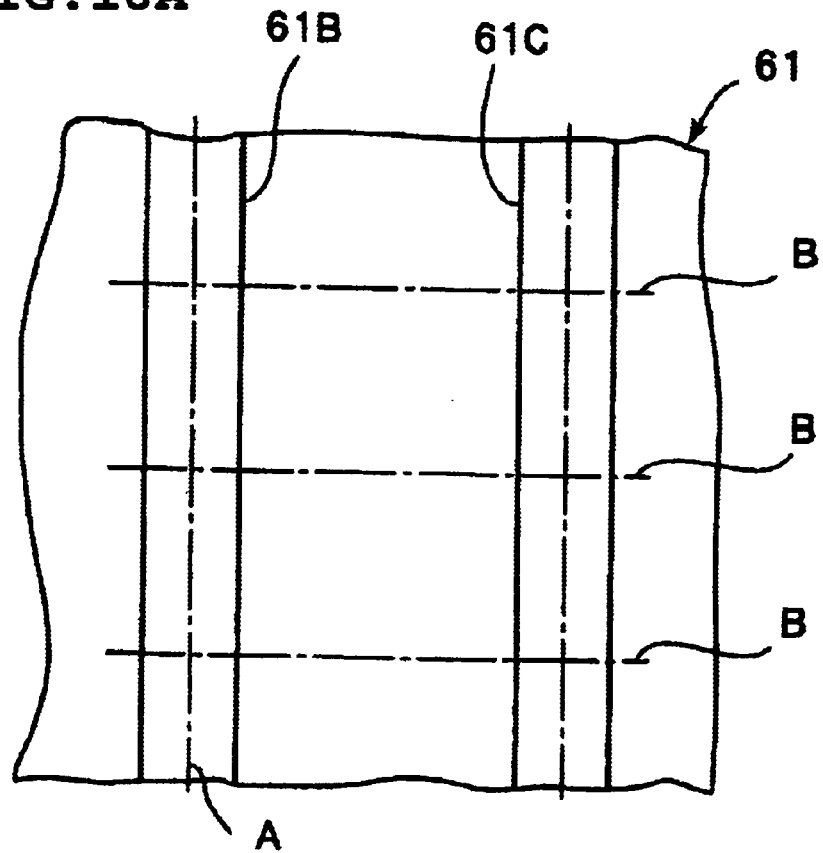
FIG. 18A is a partially cutaway view illustrating a mother composite sheet formed according to the second preferred embodiment of the present invention.
Figure 18B:
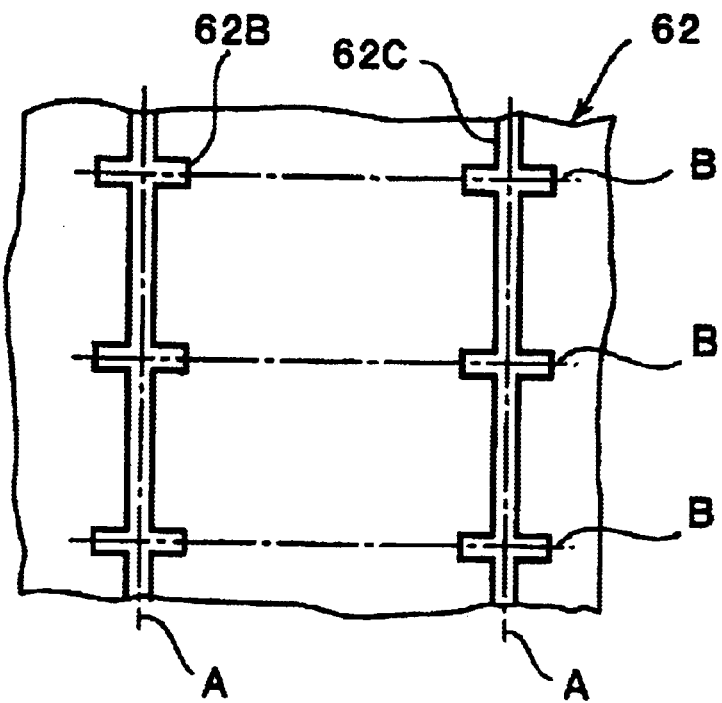
FIG. 18B is a partially cutaway view illustrating a mother composite sheet formed according to the second preferred embodiment of the present invention.

On the top and the bottom surface of the structure formed by repeatedly laminating the composite sheets 53 and 54 with the composite sheet 52 provided therebetween, the composite sheets 52, 52 are laminated, and in addition, the composite sheets 51, 51 are laminated thereon as the outermost layers. In this preferred embodiment, mother composite sheets are prepared for constituting the composite sheets 51 to 54 and are then laminated with each other, such that a mother laminate is formed. FIGS. 18A and 18B are partially cutaway views showing mother composite sheets for forming the composite sheets 51 and 52, respectively. That is, a mother composite sheet 61 has mother conductors 61B and 61C, and a mother composite sheet 62 has mother conductors 62B and 62C. Chain lines A and B in FIGS. 18A and 18B indicate cutting positions when the mother laminates are cut. When the mother laminates are cut, the mother conductors 61B and 61C are divided so as to form the conductors 51b and 51c, respectively, and the mother conductors 62B and 62C are divided so as to form the conductors 52b and 52c, respectively.

Figure 19A:
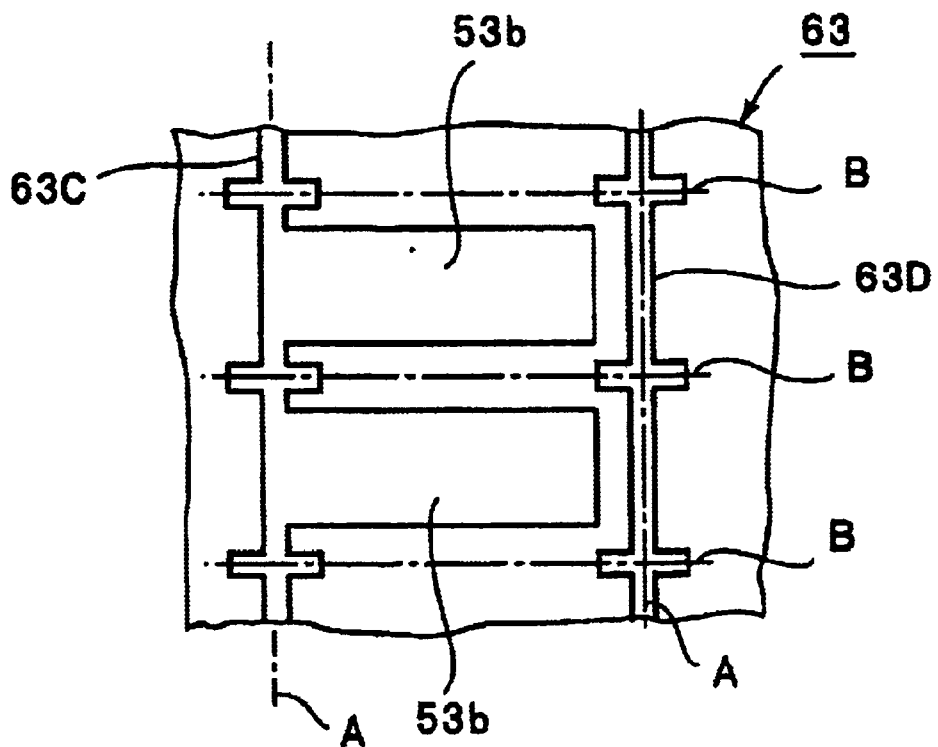
FIG. 19A is a partially cutaway view illustrating a mother composite sheet formed according to the second preferred embodiment of the present invention.
Figure 19B:
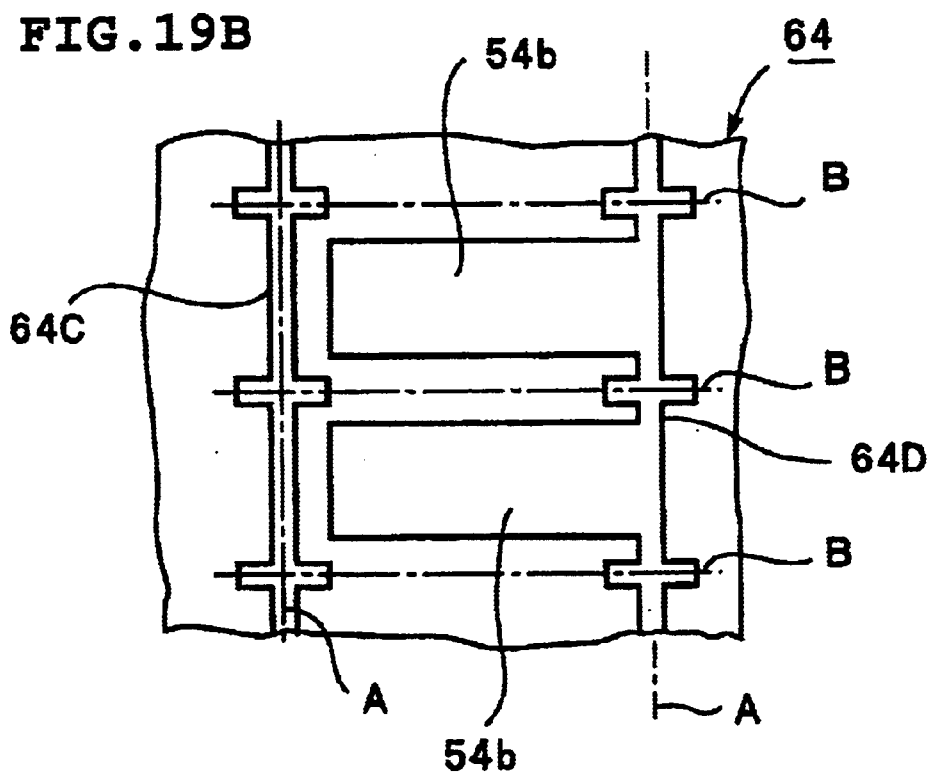
FIG. 19B is a partially cutaway view illustrating a mother composite sheet formed according to the second preferred embodiment of the present invention.

FIGS. 19A and 19B are partially cutaway views showing mother composite sheets 63 and 64 for forming the composite sheets 53 and 54, respectively. Chain lines A and B in FIGS. 18A and 18B indicate cutting positions when the mother laminates are cut.

In each area surrounded by the chain lines A and B in FIG. 19A, one capacitor electrode 53b is provided, and in each area surrounded by the chain lines A and B in FIG. 19B, one capacitor electrode 54b is provided. In addition, mother conductors 63C and 63D preferably have shapes which form the conductors 53c and 53d after cutting is performed, and similarly to the above, mother conductors 64C and 64D have shapes which form the conductors 54c and 54d after cutting is performed.

Accordingly, in this preferred embodiment, as is the case of the first preferred embodiment, a mother laminate can also be obtained by laminating mother green sheets 61 to 64 in the order shown in FIG. 17. In addition, by cutting the mother laminate along the positions shown by the chain lines A and B, individual laminates each forming one laminated capacitor can be obtained.

Furthermore, by firing the laminates described above, firing of the capacitor electrodes 53b and 54b and firing of the external electrodes can be simultaneously performed with the firing of the ceramic.

In the second preferred embodiment, since the capacitance electrodes 53b and 54b are arranged so as to have substantially the same thicknesses of those of the ceramic green sheets 53a and 54a, the thickness of the internal electrode can be increased, and hence, a laminated capacitor can be obtained having a low DC resistance and a large static capacitance.

In the second preferred embodiment, as is the case with individual modified examples of the first preferred embodiment, the external electrodes may be formed so as to have substantially round inner and outer peripheries thereof at the corners defined by the edge surfaces and the bent portions. In addition, by increasing the widths of the conductors constituting the external electrodes in the direction from the approximate center of the laminated capacitor to the top and to the bottom thereof, substantially round ridgelines defined by the edge surfaces with the top and the bottom surfaces of the laminated capacitor can be easily formed.

In the first preferred embodiment, a so-called vertical winding laminated inductor was formed in which the coil conductor is wound in the direction that is substantially perpendicular to the direction from the external electrode 3 to the external electrode 4 disposed on the two edge surfaces of the sintered ceramic body 2. In addition to the above, as shown in FIG. 20, a so-called horizontal winding laminated inductor may be formed in which the coil conductor is wound in the direction from one external electrode to the other external electrode.

Figure 20:
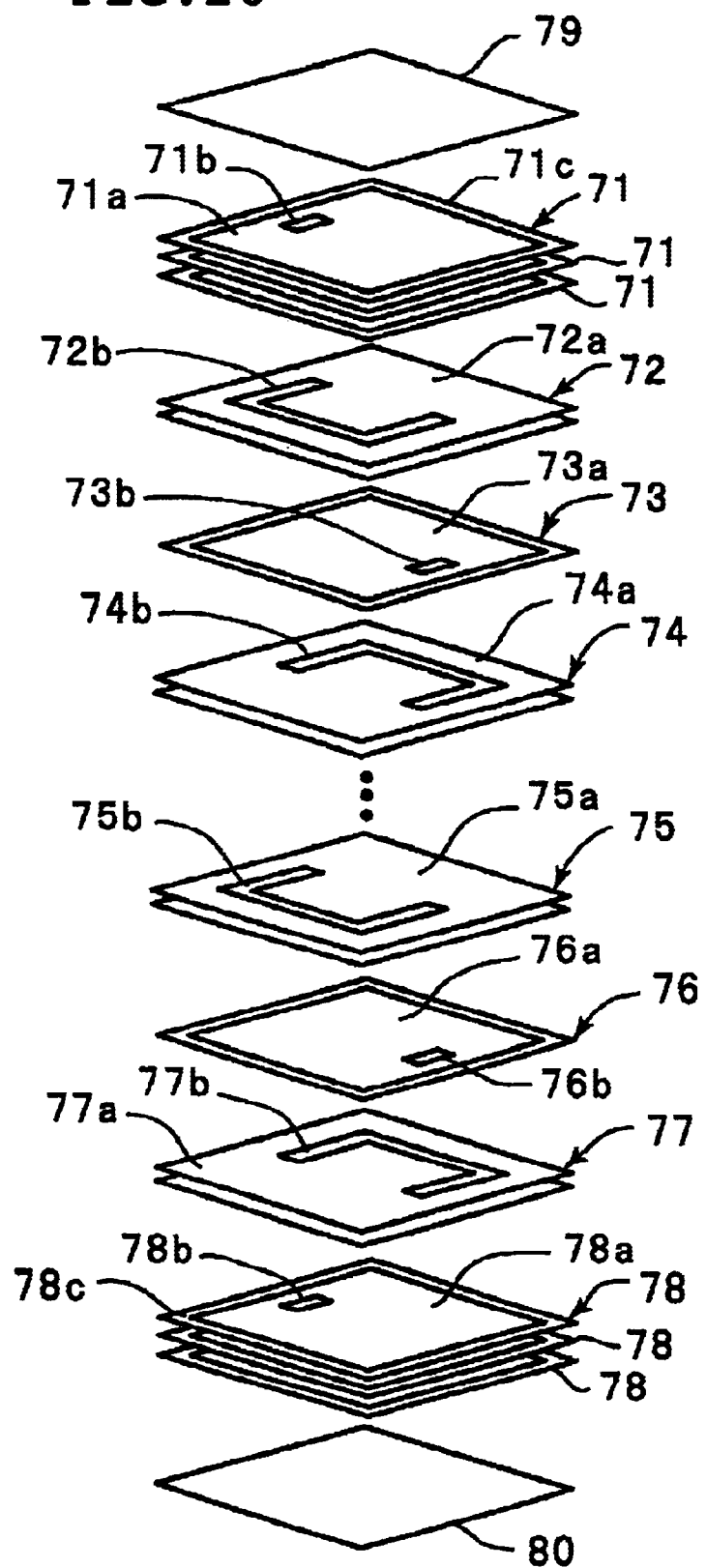
FIG. 20 is an exploded perspective view illustrating another modified example of the first preferred of the present invention.

FIG. 20 is an exploded perspective view showing a horizontal winding laminated inductor before it is fired. In this modified example, composite sheets 71 to 78 are laminated with each other. The composite sheets 72 to 77 include ceramic green sheets 72a to 77a and internal electrodes 72b to 77b constituting a coil conductor, respectively. That is, the internal electrodes 72b to 77b are electrically connected to each other, thereby forming the coil conductor. In this example, the internal electrode 72b is also arranged so as to be in contact with the ceramic green sheet 72, that is, it is arranged to penetrate the composite sheet 72. The internal electrodes 73b to 77b are formed in a manner similar to that for the internal electrode 72b described above. Accordingly, a large inductance can be obtained.

In addition, the composite sheets 71 and 78 preferably include ceramic green sheets 71a and 78a, internal electrodes 71b and 78b defining a connecting electrode, and conductors 71c and 78c provided along the peripheries of the ceramic green sheets, respectively. The internal electrode 71b is arranged so as to penetrate the composite sheet 71 and is connected to the coil conductor described above at the one end thereof. In a manner similar to the above, the internal electrode 78b is preferably arranged to penetrate the composite sheet 78 and is connected to the coil conductor described above at the one end thereof. In addition, the outer side surfaces of the internal electrodes 71b and 78b in the laminated direction are exposed.

Furthermore, the conductors 71c and 78c preferably have a strip shape and are disposed along the peripheries of the substantially rectangular composite sheets 71 and 78, respectively. The conductors 71c and 78c are arranged to form bent portions of the external electrodes of the laminated inductor at a final stage. Accordingly, in this modified example, a plurality of composite sheets 71 and a plurality of composite sheets 78 define laminates, respectively.

In this example, a mother laminate is obtained by laminating mother composite sheets corresponding to the composite sheets 71 to 78, and the entire two surfaces at the two sides of the mother laminate in the laminated direction are coated with a conductive paste. Subsequently, the mother laminate is cut into individual laminates each forming one laminated inductor. In the individual laminate forming one laminated inductor, conductive paste layers 79 and 80 are disposed at an upper side and a lower side in the laminated direction in the exploded view in FIG. 20. In addition, since the conductors 71c and 78c are connected to the conductive paste layers 79 and 80, respectively, by firing the laminate thus formed, a laminated inductor can be directly obtained as is the case with the first preferred embodiment.

As a result, after firing is performed, a complicated step of forming the external electrodes is not necessary to perform.

Figure 21:
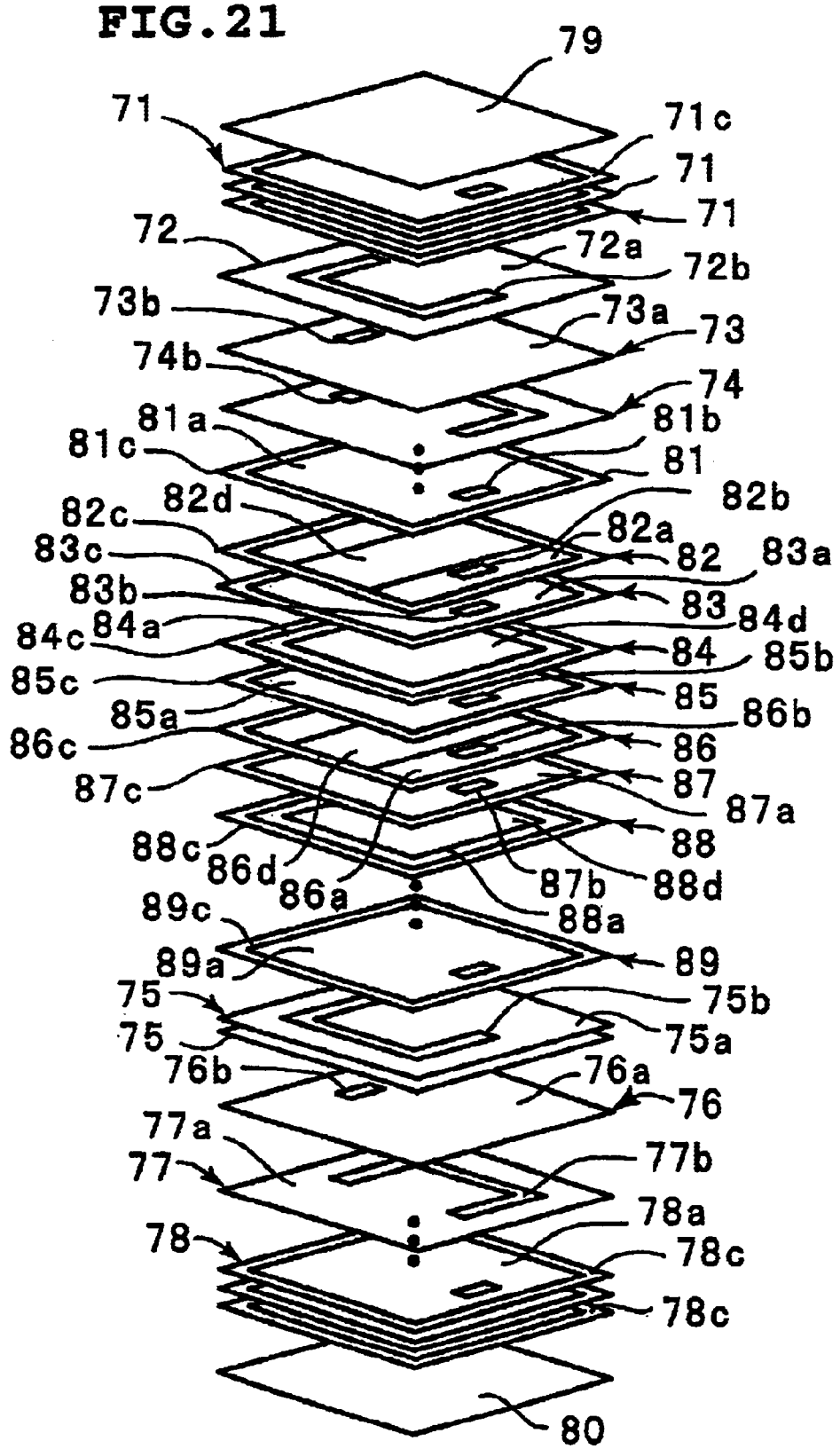
FIG. 21 is an exploded perspective view showing a laminate for forming a laminated LC element of still another modified example according to the modified example shown in FIG. 20.

FIG. 21 is an exploded perspective view showing another modified example of the horizontal winding laminated inductor shown in FIG. 20. In this example, a capacitor is integrated into the horizontal winding laminated inductor. That is, between the composite sheets 74 and 75, a laminate including composite sheets 81 to 89 is arranged to constitute a capacitor. The composite sheets 81 to 83, 85 to 87, and 89 have conductive pastes 81b, 82b, 83b, 85b, 86b, 87b, and 89b as connecting electrodes for electrically connecting the coil conductors located at the upper and the lower sides. In addition, in the composite sheets 81 to 89, conductors 81c to 89c having a strip shape are formed along the substantially rectangular peripheries of ceramic green sheets 81a to 89a. In addition, the composite sheets 82, 84, 86, and 88 include internal electrodes 82d, 84d, 86d, and 88d, respectively, for obtaining static capacitance. Among these internal electrodes, the capacitance electrodes 82d and 86d are electrically connected to conductors 82c and 86c, respectively. The capacitance electrode 84d is separated from the conductor 84c disposed along the periphery of the same composite sheet, and in a manner similar to the above, the capacitance electrode 88d is separated from the conductor 88c. In addition, the capacitance electrode 84d of the composite sheet 84 is connected to the internal electrodes 83b and 85b of the composite sheets 83 and 85 adjacent to the composite sheet 84. In a manner similar to the capacitance electrode 84d, the capacitance electrode 88d is connected to the internal electrodes 87b and 89b.

Accordingly, when mother composite sheets corresponding to the composite sheets 71 to 78 are laminated with the composite sheets 81 to 89, and conductive layers are formed on the entire surfaces of the top and the bottom of the laminate thus formed, a mother laminate can be obtained. By cutting the mother laminate thus formed, individual laminates each defining one electronic element shown in FIG. 21 can be obtained. Numeral references 79 and 80 indicate the conductive paste layers formed as mentioned above.

Figure 22:
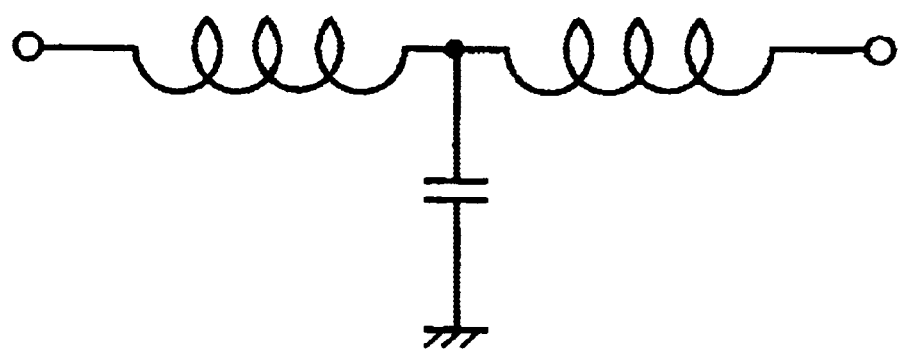
FIG. 22 is a diagram showing a circuit of the laminated LC element formed in the modified example shown in FIG. 21.

As a result, according to this example, there are provided a first external electrode including the conductive paste layer 79 and the conductors 71c of the composite sheets 71 at the upper portion of the laminate, a second external electrode disposed along the peripheries of the composite sheets 81 to 89, and a third external electrode including the conductors 78c of the composite sheets 78 and the conductive paste layer 80. The top end of the coil conductor is electrically connected to the first external electrode, and the bottom end of the coil conductor is electrically connected to the third external electrode. In addition, between the top and the bottom ends of the coil conductor, the capacitance electrodes 84d and 88d are electrically connected to the coil conductor, whereby capacitors are provided between the capacitance electrodes 84d and 82d and between the capacitance electrodes 88d and 86d. Furthermore, the capacitance electrodes 82d and 86d are electrically connected to the second external electrode. As a result, an LC filter can be formed having a circuit diagram shown in FIG. 22.

In this LC filter, a step of forming the external electrode is not necessary to perform after the sintered ceramic body was formed.

In addition, in preferred embodiments and the modified examples described above, the laminate is preferably formed by laminating composite sheets formed on the carrier films by a transfer method. However, a laminate including composite sheets may be formed by steps of removing the carrier films from the composite sheets, laminating the composite sheets, and compressing laminated composite sheets in the thickness direction thereof.

The method for manufacturing a laminated ceramic electronic component according to various preferred embodiments of the present invention includes the steps of forming composite sheets each having a conductor and a ceramic layer provided at the side the conductor on a carrier film, laminating the composite sheets with each other for forming a first laminated body, and cutting the first laminated body in the thickness direction thereof so as to divide the conductor for forming a second laminated body. The second laminated body has the conductor exposed on the cut surface, and by firing the second laminated body, a sintered ceramic body and an exposed external electrode formed of the conductor can be simultaneously obtained.

Accordingly, a complicated step of forming an external electrode is not necessary to perform after the sintered ceramic body is obtained. In addition, in the case in which an internal electrode is formed, when the internal electrode and the external electrode are connected with each other on at least one composite sheet, the reliability of electrical connection therebetween is greatly improved. As a result, an inexpensive laminated ceramic electronic component can be provided having superior reliability.

When the composite sheets are laminated with each other, after the composite sheet formed on the carrier film is bonded by compression to a lamination stage or to a composite sheet previously laminated, a transfer method may be performed which separate the carrier film from the composite sheet, or after the composite sheets are separated form the corresponding carrier sheets, the composite sheets may be laminated with each other and may be then compressed in the thickness direction thereof. In particular, when the composite sheets are thin, the former method is preferably used. In addition, when the conductor and the ceramic layer adjacent thereto are tightly bonded to each other, the latter method may be used for forming the laminate.

In the forming step of forming the composite sheet on the carrier film, the conductors and the ceramic layers may be printed at least two times. In the case described above, a composite sheet including a plurality of conductors and a plurality of ceramic layers is formed, whereby the laminating step can be simplified.

When the conductor has an edge surface portion extending along the cut surface exposed by the cutting step and a pair of bent portions bent inside from the cut surface at the two ends of the edge surface portion when viewed from above, an external electrode, having an edge surface portion extending along the edge surface of a sintered body and bent portions extend to the two side surfaces contacting with the edge surface, can be easily formed in the final sintered ceramic body.

In the cutting step of cutting the first laminated body, when the first laminated body is also cut in the direction that is substantially perpendicular to the cut surface, second laminated bodies having a substantially rectangular shape can be obtained. In addition, in the second laminated body, when a pair of bent portions of the conductor are arranged to extend to the pair of side surfaces contacting with the pair of edge surfaces at which the cut surfaces of the conductors extend, a laminated ceramic electronic component having a substantially rectangular shape can be formed having external electrode portions extending along the edge surfaces and external electrode bent portions extending to the side surfaces.

When the conductor of a composite sheet disposed at the outermost position of the first laminated body has a bent portion extending inside from the edge surface at which the external electrode is exposed by the cutting step, in a sintered ceramic body finally obtained, bent portions of the external electrodes can be formed on the outermost surfaces in the laminated direction contacting with the edge surfaces, and hence, a laminated ceramic electronic component preferably used in surface mounting can be provided.

When the conductor having the edge surface portion and the pair of bent portions is arranged so that the inner portion of the corner defined by the edge surface portion and the bent portions has a substantially round shape, the substantially round shape can be easily formed by a barrel polishing at the corners defined by the edge surface portions and the bent portions of the external electrodes. In addition, even in the case described above, wire breakage between the edge surface portion and the bent portions of the external electrode is prevented.

When the external electrode having the edge surface portion and the pair of bent portions is arranged such that the outer periphery of the external electrode has a substantially round shape at the corners defined by the edge surface portion and the bent portions, the amount of polishing of the external electrode at the outer periphery thereof is greatly reduced.

In the case in which the length from the cut surface of the edge surface portion of the conductor, having the edge surface portion and the pair of bent portions, to the other side of the edge surface portion opposite to the cut surface is defined as the width of the conductor, when a conductor disposed at an outer side in the laminated direction has a larger width, the inner periphery of the external electrode at the corner thereof formed by the edge surface portion and the outer side surface in the laminated direction has a substantially round shape. Accordingly, although the external electrode is polished by barrel polishing so that the corner portion has a substantially round shape, wire breakage is prevented.

In the case in which a conductor is formed in the composite sheet by printing, and a second conductor constituting the internal electrode is also formed, when the conductor forming the external electrode and the second conductor are connected to each other, a laminated ceramic electronic component can be easily provided having superior reliability of electrical connection between the internal electrode and the external electrode.

While the present invention has been particularly shown and described with reference to preferred embodiments thereof, it will be understood by those skilled in the art that the foregoing and other changes in form and details can be made without departing from the spirit and scope of the invention.

What is claimed is:

1. A method for manufacturing a laminated ceramic electronic component, comprising the steps of:

forming composite sheets, each having a conductor portion and a ceramic layer portion, on a carrier film;

laminating the composite sheets with each other and separating each of the composite sheets from the carrier film to obtain a first laminated body;

cutting the first laminated body in a thickness direction thereof so as to divide the conductor portions to obtain at least one second laminated body having the conductor portions exposed on one of the cut surfaces; and firing the at least one second laminated body to obtain a sintered ceramic body having an external electrode formed of the exposed conductor portions.

2. The method according to claim 1, wherein the laminating step includes the steps of press-bonding each of the composite sheets formed on the carrier film to a lamination stage or to a composite sheet that was previously laminated, separating the carrier film from each of the composite sheets, and repeating the steps of press bonding and separating.

3. The method according to claim 1, wherein the laminating step includes the steps of separating the composite sheets from the carrier films, laminating the composite sheets with each other after the separating step, and compressing the first laminated body in a thickness direction thereof.

4. The method according to claim 1, wherein the forming composite sheets step includes a step of printing the conductor portion and the ceramic layer portion at least two times so as to form each of the composite sheets.

5. The method according to claim 1, wherein the external electrode includes an edge surface portion extending along one of the cut surfaces exposed by the cutting and a pair of bent portions bent inside from the one of the cut surfaces at both ends of the edge surface portion.

6. The method according to claim 5, further comprising a step of cutting the first laminated body in a direction that is substantially perpendicular to the cut surface that includes the edge surface portion, wherein the at least one second laminated body formed during the cutting step has a substantially rectangular body having a pair of edge surfaces and a pair of side surfaces connecting therewith and the pair of bent portions are formed so as to extend along the pair of side surfaces.

7. The method according to claim 1, wherein the conductor portion of a composite sheet disposed at an outermost layer of the first laminated body has a pair of bent portions extending inside from an edge surface portion of the external electrode that is exposed by the cutting.

8. The method according to claim 5, wherein the external electrode having the edge surface portion and the pair of bent portions is formed such that an inner portion of a corner defined by the edge surface portion and the pair of bent portions has a substantially round shape.

9. The method according to claim 5, wherein the external electrode having the edge surface portion and the pair of bent portions is formed such that an outer portion of a corner defined by the edge surface portion and the bent portion has a substantially round shape.

10. The method according to claim 7, wherein a width of the edge surface portion of the external electrode increases toward the outermost layer of the at least one second laminated body along a laminating direction.

11. The method according to claim 7, wherein widths of the pair of bent portions of the external electrode increase toward the outermost layer of the at least one second laminated body along a laminating direction.

12. The method according to claim 1, wherein the forming step includes a step of forming a second conductor portion constituting an internal electrode which is performed at the same time that the conductor portion is formed.

13. The method according to claim 1, wherein in the firing step, the at least one second laminated body and a plurality of the external electrode are simultaneously formed.

14. The method according to claim 1, wherein a plurality of the external electrodes are formed during the step of firing and no additional steps are required for forming the plurality of external electrodes.

15. The method according to claim 1, further comprising a step of forming a plurality of internal electrodes and a plurality of external electrodes so as to be electrically connected to each other, wherein the plurality of internal electrodes and the plurality of external electrodes are fired at the same time during the step of firing.

16. A laminated ceramic electronic component manufactured according to the method of claim 1.

17. The method according to claim 1, wherein in the step of forming composite sheets, the conductor portion and the ceramic layer portion of each of the composite sheets do not overlap.

18. The method according to claim 15, wherein the plurality of internal electrodes are arranged such that the laminated ceramic electronic component comprises an inductor.

19. The method according to claim 15, wherein the plurality of internal electrodes are arranged such that the laminated ceramic electronic component comprises a capacitor.

20. A method for manufacturing a laminated ceramic electronic component, comprising the steps of:
    forming composite sheets, each having a conductor portion and a ceramic layer portion, on a carrier film;
    laminating the composite sheets with each other and separating each of the composite sheets from the carrier film to obtain a first laminated body;
    cutting the first laminated body in a thickness direction thereof to obtain at least one second laminated body; and
    firing the at least one second laminated body to obtain a sintered ceramic body, with the conductor portions forming a continuous external electrode on an edge surface of the laminated ceramic electronic component.

21. The method according to claim 20, wherein the laminating step includes the steps of press-bonding each of the composite sheets formed on the carrier film to a lamination stage or to a composite sheet that was previously laminated, separating the carrier film from each of the composite sheets, and repeating the steps of press bonding and separating.

22. The method according to claim 20, wherein the laminating step includes the steps of separating the composite sheets from the carrier films, laminating the composite sheets with each other after the separating step, and compressing the first laminated body in a thickness direction thereof.

23. The method according to claim 20, wherein the forming composite sheets step includes a step of printing the conductor portion and the ceramic layer portion at least two times so as to form each of the composite sheets.

24. The method according to claim 20, wherein the external electrode includes an edge surface portion extending along one of the cut surfaces and a pair of bent portions bent inside from the edge surface portion at both ends of the edge surface portion.

25. The method according to claim 24, further comprising a step of cutting the first laminated body in a direction that is substantially perpendicular to the cut surface that includes the edge surface portion, wherein the at least one second laminated body formed during the cutting step has a substantially rectangular body having a pair of edge surfaces and a pair of side surfaces connecting therewith and the pair of bent portions are formed so as to extend along the pair of side surfaces.

26. The method according to claim 20, wherein the conductor portion of one of the composite sheets disposed at an outermost layer of the first laminated body has a pair of bent portions extending inside from an edge surface portion of the external electrode.

27. The method according to claim 24, wherein the external electrode is formed such that an inner portion of a corner defined by the edge surface portion and the bent portion has a substantially round shape.

28. The method according to claim 24, wherein the external electrode is formed such that an outer portion of a corner defined by the edge surface portion and the bent portion has a substantially round shape.

29. The method according to claim 26, wherein a width of the edge surface portion of the external electrode increases toward the outermost layer of the at least one second laminated body along a laminating direction.

30. The method according to claim 26, wherein widths of the pair of bent portions of the external electrode increase toward the outermost layer of the at least one second laminated body along a laminating direction.

31. The method according to claim 20, wherein the forming step includes a step of forming a second conductor portion constituting an internal electrode which is performed at the same time that the conductor portion is formed.

32. The method according to claim 20, wherein in the firing step, the at least one second laminated body and a plurality of the external electrode are simultaneously formed.

33. The method according to claim 20, wherein a plurality of the external electrodes are formed during the step of firing and no additional steps are required for forming the plurality of external electrodes.

34. The method according to claim 20, further comprising a step of forming a plurality of internal electrodes and a plurality of external electrodes so as to be electrically connected to each other, wherein the plurality of internal electrodes and the plurality of external electrodes are fired at the same time during the step of firing.

35. A laminated ceramic electronic component manufactured according to the method of claim 20.

36. The method according to claim 20, wherein in the step of forming composite sheets, the conductor portion and the ceramic layer portion of each of the composite sheets do not overlap.

37. The method according to claim 34, wherein the plurality of internal electrodes are arranged such that the laminated ceramic electronic component is an inductor.

38. The method according to claim 34, wherein the plurality of internal electrodes are arranged such that the laminated ceramic electronic component is a capacitor.

39. A method for manufacturing a laminated ceramic electronic component, comprising the steps of:
    forming composite sheets, each having a conductor portion and a ceramic layer portion, on a carrier film;
    laminating the composite sheets with each other and separating each of the composite sheets from the carrier film to obtain a first laminated body;
    cutting the first laminated body in a thickness direction thereof so as to obtain at least one second laminated body; and firing the at least one second laminated body to obtain a sintered ceramic body with the conductor portions forming an external electrode, with at least a portion of the external electrode extending on at least one of the top and bottom surfaces of the laminated ceramic electronic component.

40. The method according to claim 39, wherein the laminating step includes the steps of press-bonding each of the composite sheets formed on the carrier film to a lamination stage or to a composite sheet that was previously laminated, separating the carrier film from each of the composite sheets, and repeating the steps of press bonding and separating.

41. The method according to claim 39, wherein the laminating step includes the steps of separating the composite sheets from the carrier films, laminating the composite sheets with each other after separating, and compressing the first laminated body in the thickness direction thereof.

42. The method according to claim 39, wherein the forming composite sheets step includes a step of printing the conductor portion and the ceramic layer portion at least two times so as to form each of the composite sheets.

43. The method according to claim 39, wherein the external electrode includes an edge surface portion extending along one of the cut surfaces exposed by the cutting and a pair of bent portions bent inside from the one of the cut surfaces at both ends of the edge surface portion.

44. The method according to claim 43, further comprising a step of cutting the first laminated body in a direction that is substantially perpendicular to the cut surface that includes the edge surface portion, wherein the at least one second laminated body formed during the cutting step has a substantially rectangular body having a pair of edge surfaces and a pair of side surfaces connecting therewith and the pair of bent portions are formed so as to extend along the pair of side surfaces.

45. The method according to claim 39, wherein the conductor portion of one of the composite sheets disposed at an outermost layer of the at least one second laminated body has a pair of bent portions extending inside from an edge surface portion of the external electrode.

46. The method according to claim 43, wherein the external electrode having the edge surface portion and the pair of bent portions is formed such that an inner portion of a corner defined by the edge surface portion and the pair of bent portions has a substantially round shape.

47. The method according to claim 43, wherein the external electrode having the edge surface portion and the pair of bent portions is formed such that an outer portion of a corner defined by the edge surface portion and the bent portion has a substantially round shape.

48. The method according to claim 45, wherein a width of the edge surface portion of the external electrode increases toward the outermost layer of the at least one second laminated body along a laminating direction.

49. The method according to claim 45, wherein widths of the pair of bent portions of the external electrode increase toward the outermost layer of the at least one second laminated body along a laminating direction.

50. The method according to claim 39, wherein the forming step includes a step of forming a second conductor portion constituting an internal electrode which is performed at the same time that the conductor portion is formed.

51. The method according to claim 39, wherein in the firing step, the at least one second laminated body and a plurality of the external electrodes are simultaneously formed.

52. The method according to claim 39, wherein a plurality of the external electrodes are formed during the step of firing and no additional steps are required for forming the plurality of external electrodes.

53. The method according to claim 39, further comprising a step of forming a plurality of internal electrodes and a plurality of external electrodes so as to be electrically connected to each other, wherein the plurality of internal electrodes and the plurality of external electrodes are fired at the same time during the step of firing.

54. A laminated ceramic electronic component manufactured according to the method of claim 39.

55. The method according to claim 39, wherein in the step of forming composite sheets, the conductor portion and the ceramic layer portion of each of the composite sheets do not overlap.

56. The method according to claim 53, wherein the plurality of internal electrodes are arranged such that the laminated ceramic electronic component comprises an inductor.

57. The method according to claim 53, wherein the plurality of internal electrodes are arranged such that the laminated ceramic electronic component comprises a capacitor.

58. The method according to claim 13, wherein the plurality of internal electrodes are arranged such that the laminated ceramic electronic component comprises an LC filter.

59. The method according to claim 33, wherein the plurality of internal electrodes are arranged such that the laminated ceramic electronic component comprises an LC filter.

60. The method according to claim 57, wherein the plurality of internal electrodes are arranged such that the laminated ceramic electronic component comprises an LC filter.

61. A method for manufacturing a laminated ceramic electronic component, comprising the steps of:

forming composite sheets, each having a conductor portion and a ceramic layer portion, on a carrier film;

laminating the composite sheets with each other to obtain a first laminated body;

cutting the first laminated body in a thickness direction thereof so as to divide the conductor portions to obtain at least one second laminated body having the conductor portions exposed on one of the cut surfaces; and firing the at least one second laminated body to obtain a sintered ceramic body having an external electrode formed of the exposed conductor portions, wherein the external electrode is formed on the left and right sides of the plurality of the composite sheets.

* * * * *